US012563875B2

(12) United States Patent
He et al.

(10) Patent No.: US 12,563,875 B2
(45) Date of Patent: Feb. 24, 2026

(54) WIRING BOARD, FUNCTIONAL BACKPLANE, BACKLIGHT MODULE, DISPLAY PANEL AND DISPLAY APPARATUS

(71) Applicant: BOE TECHNOLOGY GROUP CO., LTD., Beijing (CN)

(72) Inventors: Jiayu He, Beijing (CN); Yan Qu, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN); Feifei Li, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 475 days.

(21) Appl. No.: 17/927,792

(22) PCT Filed: Dec. 29, 2021

(86) PCT No.: PCT/CN2021/142667
§ 371 (c)(1),
(2) Date: Nov. 25, 2022

(87) PCT Pub. No.: WO2023/123116
PCT Pub. Date: Jul. 6, 2023

(65) Prior Publication Data
US 2024/0234658 A1 Jul. 11, 2024

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H01L 25/167* (2013.01); *H10D 86/441* (2025.01); *H10D 86/60* (2025.01)

(58) Field of Classification Search
CPC . H10H 20/857; H01L 25/0753; H01L 25/167; H10D 86/441; H10D 86/60; H05K 3/35; C23C 18/52
See application file for complete search history.

(56) References Cited

U.S. PATENT DOCUMENTS 6,519,845 B1    2/2003    Cutting et al.
6,620,720 B1    9/2003    Moyer et al.
(Continued)

FOREIGN PATENT DOCUMENTS

CN          1964067 A     5/2007
CN          101174601 A    5/2008
(Continued)

OTHER PUBLICATIONS

International Search Report and Written Opinion for the PCT Application No. PCT/CN2022/077542 by the International Searching Authority on Oct. 10, 2022.
(Continued)

*Primary Examiner* — Galina G Yushina
(74) *Attorney, Agent, or Firm* — XSENSUS LLP

(57) ABSTRACT

A wiring board includes a substrate, conductive pads and at least one protective layer group. The conductive pads are disposed on the substrate. The at least one protective layer group is disposed on a side of the conductive pads away from the substrate; a protective layer group includes an oxidation protective layer and a palladium alloy layer that are stacked, and the oxidation protective layer is closer to the substrate than the palladium alloy layer. A material of the oxidation protective layer includes a nickel-based alloy.

19 Claims, 9 Drawing Sheets

(51) Int. Cl.
 *H01L 25/16* (2023.01)
 *H10D 86/40* (2025.01)
 *H10D 86/60* (2025.01)

(56) References Cited

U.S. PATENT DOCUMENTS

| | | | | | |
|---|---|---|---|---|---|
| 8,354,009 | B2 | 1/2013 | Han et al. | | |
| 2002/0076911 | A1* | 6/2002 | Lin | H01L 23/3128 | |
| | | | | 257/E21.309 | |
| 2003/0127701 | A1* | 7/2003 | Tiziani | H01L 24/48 | |
| | | | | 257/459 | |
| 2004/0166702 | A1* | 8/2004 | Higashi | H01R 13/2407 | |
| | | | | 439/66 | |
| 2006/0222821 | A1 | 10/2006 | Masai | | |
| 2007/0120233 | A1* | 5/2007 | Tellkamp | H01L 24/97 | |
| | | | | 257/E23.054 | |
| 2007/0122649 | A1 | 5/2007 | Lee et al. | | |
| 2007/0232051 | A1 | 10/2007 | Wang et al. | | |
| 2008/0081157 | A1 | 4/2008 | Schneegans et al. | | |
| 2008/0096015 | A1 | 4/2008 | Yan | | |
| 2008/0122086 | A1 | 5/2008 | Tsao et al. | | |
| 2008/0169539 | A1 | 7/2008 | Fang et al. | | |
| 2008/0264681 | A1 | 10/2008 | Iwal et al. | | |
| 2009/0297879 | A1 | 12/2009 | Zeng et al. | | |
| 2010/0213608 | A1 | 8/2010 | Lau et al. | | |
| 2010/0301484 | A1 | 12/2010 | Bchir et al. | | |
| 2011/0006415 | A1 | 1/2011 | Bachman et al. | | |
| 2011/0062580 | A1 | 3/2011 | Liu et al. | | |
| 2011/0186872 | A1 | 8/2011 | Kim | | |
| 2011/0220940 | A1 | 9/2011 | Kim | | |
| 2013/0000978 | A1 | 1/2013 | Choi et al. | | |
| 2013/0107155 | A1 | 5/2013 | Guo et al. | | |
| 2013/0241058 | A1 | 9/2013 | Yu et al. | | |
| 2015/0099316 | A1 | 4/2015 | Ryu et al. | | |
| 2016/0233181 | A1* | 8/2016 | Uemura | H01L 24/05 | |
| 2017/0250171 | A1 | 8/2017 | Yu et al. | | |
| 2017/0263645 | A1 | 9/2017 | Liu et al. | | |
| 2017/0358546 | A1 | 12/2017 | Shim et al. | | |
| 2019/0114957 | A1 | 4/2019 | Fan et al. | | |
| 2019/0229446 | A1 | 7/2019 | Kim et al. | | |
| 2020/0035147 | A1 | 1/2020 | Ban et al. | | |
| 2020/0168461 | A1 | 5/2020 | Wang et al. | | |
| 2021/0043817 | A1 | 2/2021 | Liang et al. | | |
| 2021/0125566 | A1 | 4/2021 | Yang et al. | | |
| 2021/0143134 | A1* | 5/2021 | Wang | H01L 23/15 | |
| 2021/0223631 | A1 | 7/2021 | Ban et al. | | |
| 2021/0242146 | A1* | 8/2021 | Arvin | H04L 24/11 | |
| 2021/0294158 | A1 | 9/2021 | Wang et al. | | |
| 2021/0358896 | A1 | 11/2021 | Lee et al. | | |
| 2021/0359182 | A1 | 11/2021 | Cao et al. | | |
| 2022/0181245 | A1 | 6/2022 | Ko et al. | | |
| 2024/0234658 | A1 | 7/2024 | He et al. | | |
| 2024/0260185 | A1 | 8/2024 | Zhang et al. | | |

FOREIGN PATENT DOCUMENTS

| | | | |
|---|---|---|---|
| CN | 101452988 | A | 6/2009 |
| CN | 101471318 | A | 7/2009 |
| CN | 102024769 | A | 4/2011 |
| CN | 102148318 | A | 8/2011 |
| CN | 102194936 | A | 9/2011 |
| CN | 202095173 | U | 12/2011 |
| CN | 202159705 | U | 3/2012 |
| CN | 102437135 | A | 5/2012 |
| CN | 103904172 | A | 7/2014 |
| CN | 104201121 | A | 12/2014 |
| CN | 104244566 | A | 12/2014 |
| CN | 104561943 | A | 4/2015 |
| CN | 104810457 | A | 7/2015 |
| CN | 105578709 | A | 5/2016 |
| CN | 105789218 | A | 7/2016 |
| CN | 206471352 | U | 9/2017 |
| CN | 107507809 | A | 12/2017 |
| CN | 107768343 | A | 3/2018 |
| CN | 109031779 | A | 12/2018 |
| CN | 109449087 | A | 3/2019 |
| CN | 109524303 | A | 3/2019 |
| CN | 109597245 | A | 4/2019 |
| CN | 109686719 | A | 4/2019 |
| CN | 110890323 | A | 3/2020 |
| CN | 111312742 | A | 6/2020 |
| CN | 210837765 | U | 6/2020 |
| CN | 111862886 | A | 10/2020 |
| CN | 112186079 | A | 1/2021 |
| CN | 112951791 | A | 6/2021 |
| CN | 113066834 | A | 7/2021 |
| CN | 113096549 | A | 7/2021 |
| CN | 113629079 | A | 11/2021 |
| CN | 113964112 | A | 1/2022 |
| CN | 113966076 | A | 1/2022 |
| CN | 114509884 | A | 5/2022 |
| CN | 114823608 | A | 7/2022 |
| EP | 2276063 | A2 | 1/2011 |
| JP | H08125310 | A | 5/1996 |
| JP | 2005322703 | A | 11/2005 |
| JP | 2006-179797 | A | 7/2006 |
| JP | 2009065116 | A | 3/2009 |
| JP | 2009253275 | A | 10/2009 |
| JP | 2011159870 | A | 8/2011 |
| JP | 2014103143 | A | 6/2014 |
| JP | 2016146377 | A | 8/2016 |
| KR | 20130068112 | A | 6/2013 |
| KR | 20210038512 | A | 4/2021 |
| TW | 200816488 | A | 4/2008 |
| TW | 201345710 | A | 11/2013 |
| TW | 201520381 | A | 6/2015 |
| WO | 2008092708 | A1 | 8/2008 |
| WO | 2009145461 | A2 | 12/2009 |
| WO | 2009145462 | A2 | 12/2009 |
| WO | 2020/153770 | A1 | 7/2020 |
| WO | 2021077354 | A1 | 4/2021 |
| WO | 2021203415 | A1 | 10/2021 |

OTHER PUBLICATIONS

International Search Report and Written Opinion for the PCT Application No. PCT/CN2022/088130 by the International Searching Authority on Dec. 19, 2022.

International Search Report and Written Opinion for the PCT Application No. PCT/CN2022/128740 by the International Searching Authority on Jul. 3, 2023.

Office Action for the Taiwanese Patent Application No. 112113817 issued by the Taiwanese Patent Office on Dec. 21, 2023.

International Search Report and Written Opinion for International Application No. PCT/CN2021/143613 issued by Chinese patent Office on Oct. 9, 2022.

Extended European search report issued on Sep. 11, 2024, in corresponding European patent Application No. 21969681.2, 11 pages.

Office Action issued on Nov. 22, 2024, in corresponding Chinese patent Application No. 202111239110.X, 14 pages.

Supplementary European Search Report mailed Feb. 19, 2025, in European Application No. 22937855.9, 7 pages.

Non-Final Rejection issued Mar. 12, 2025 in U.S. Appl. No. 18/552,754 total 10 pages.

The First Office Action mailed Jun. 18, 2025, in Chinese Application No. 202210389051.2, 15 pages including English translation.

Non-Final Rejection issued May 16, 2025 in U.S. Appl. No. 17/927,576 total 16 pages.

Notice of Allowance issued Jul. 2, 2025 in U.S. Appl. No. 18/552,754 total 8 pages.

The First Office Action mailed Sep. 18, 2025, in Chinese Application No. 202180004327.4, 15 pages including English translation.

Lin Jin-du (Editor), "A brief summary of the surface coating (plating) layers of PCB soldering pads", China Academic Journal Electronic Publishing House, Aug. 31, 2016, including English translation, total 10 pages.

(56) References Cited

OTHER PUBLICATIONS

Notice of Reasons for Refusal mailed Nov. 11, 2025, in Japanese Application No. 2023-579657, 20 pages including English translation.

\* cited by examiner

WIRING BOARD, FUNCTIONAL BACKPLANE, BACKLIGHT MODULE, DISPLAY PANEL AND DISPLAY APPARATUS

CROSS-REFERENCE TO RELATED APPLICATION

This application is a national phase entry under 35 USC 371 of International Patent Application No. PCT/CN2021/142667 filed on Dec. 29, 2021, which is incorporated herein by reference in its entirety.

TECHNICAL FIELD

The present disclosure relates to the field of display technologies, and in particular, to a wiring board, a functional backplane, a backlight module, a display panel and a display apparatus.

BACKGROUND

A mini light-emitting diode (LED) is an LED with a chip size between 50 μm and 200 μm. The chip size and a distance between chips of the mini LED are respectively larger than a chip size and a distance between chips of a traditional LED and smaller than a chip size and a distance between chips of a micro LED.

SUMMARY

In an aspect, a wiring board is provided. The wiring board includes a substrate, conductive pads and at least one protective layer group. The conductive pads are disposed on the substrate. The at least one protective layer group is disposed on a side of the conductive pads away from the substrate; a protective layer group in the at least one protective layer group includes an oxidation protective layer and a palladium alloy layer that are stacked, and the oxidation protective layer is closer to the substrate than the palladium alloy layer. A material of the oxidation protective layer includes a nickel-based alloy.

In some embodiments, the nickel-based alloy includes one or more of a nickel-palladium alloy, a copper-nickel alloy, a tungsten-nickel alloy, a nickel-aluminum alloy, a nickel-titanium alloy, a nickel-vanadium alloy, a nickel-zirconium alloy, a nickel-gold alloy, a nickel-yttrium alloy, a nickel-niobium alloy, a nickel-platinum alloy, a nickel-tin alloy, a nickel-silver alloy and a nickel-tantalum alloy.

In some embodiments, a thickness of the oxidation protective layer is in a range of 0.5 μm to 1.45 μm, inclusive.

In some embodiments, a mass proportion of nickel in the material of the oxidation protective layer is in a range of 40% to 95%, inclusive.

In some embodiments, a thickness of the palladium alloy layer is in a range of 0.05 μm to 0.1 μm, inclusive.

In some embodiments, a sum of a thickness of the oxidation protective layer and a thickness of the palladium alloy layer is in a range of 0.6 μm to 1.5 μm, inclusive.

In some embodiments, the at least one protective layer group includes a plurality of protective layer groups stacked on the side of the conductive pads away from the substrate.

In some embodiments, the wiring board further includes a protective pad layer disposed between two adjacent protective layer groups.

In some embodiments, the wiring board further includes driving circuits disposed between the substrate and the conductive pads, and a conductive pad in the conductive pads is electrically connected to a driving circuit in the driving circuits.

In some embodiments, the wiring board further includes traces, and the traces are disposed on the substrate. The conductive pads are located on a side of the traces away from the substrate, and a conductive pad in the conductive pads is electrically connected to a trace in the traces.

In some embodiments, the trace includes a first adhesive layer, a first conductive layer and an electroplated metal layer that are stacked in a direction perpendicular to the substrate and directed from the substrate to the protective layer group; or the trace includes the first adhesive layer, the first conductive layer, a second conductive layer and an anti-oxidation conductive layer that are stacked in the direction perpendicular to the substrate and directed from the substrate to the protective layer group.

In some embodiments, a material of the first adhesive layer includes one or more of a molybdenum alloy, a titanium alloy, a tungsten alloy, a nickel alloy, a molybdenum-based alloy and a nickel-based alloy; in a case where the trace includes the first adhesive layer, the first conductive layer and the electroplated metal layer, materials of the first conductive layer and the electroplated metal layer each include copper; and in a case where the trace includes the first adhesive layer, the first conductive layer, the second conductive layer and the anti-oxidation conductive layer, materials of the first conductive layer and the second conductive layer each include copper, and a material of the anti-oxidation conductive layer includes one or more of molybdenum alloy, titanium alloy, tungsten alloy, nickel alloy, a molybdenum-based alloy and a nickel-based alloy.

In some embodiments, the wiring board further includes at least one insulating layer covering the traces. The conductive pad is electrically connected to the trace through a via hole penetrating through the at least one insulating layer.

In some embodiments, the at least one insulating layer includes a first passivation layer, a planarization layer and a second passivation layer that are stacked in a direction perpendicular to the substrate and directed from the substrate to the protective layer group.

In some embodiments, the wiring board further includes a second adhesive layer disposed between the traces and the conductive pads, wherein the conductive pad is electrically connected to the trace through a portion of the second adhesive layer.

In some embodiments, a material of the second adhesive layer includes one or more of a molybdenum alloy, a titanium alloy, a tungsten alloy, a nickel alloy, a molybdenum-based alloy and a nickel-based alloy.

In another aspect, a functional backplane is provided. The functional backplane includes: the wiring board as described in any of the above embodiments; and intermetallic compound layers and conductive connection layers; an intermetallic compound layer and a conductive connection layer being stacked on the wiring board in a direction perpendicular to the substrate of the wiring board and directed from the substrate to the protective layer group; and electronic components, an electronic component being electrically connected to the conductive connection layer.

In some embodiments, the intermetallic compound layer is disposed between the conductive connection layer and the palladium alloy layer of the wiring board; or the palladium alloy layer includes hollowed-out areas; and a portion of the intermetallic compound layer is located between the palladium alloy layer and the conductive connection layer, and another portion of the intermetallic compound layer is in contact with the oxidation protective layer of the wiring board through a hollowed-out area in the hollowed-out areas.

In some embodiments, the functional backplane further includes first plating layers, and a first plating layer is disposed between the palladium alloy layer and the inter-metallic compound layer.

In some embodiments, the wiring board has a device area and a bonding area; the conductive pads include first con-ductive pads disposed in the device area, and second con-ductive pads disposed in the bonding area.

The electronic component includes a light-emitting device and a driving circuit board. The light-emitting device is bonded to a first conductive pad in the first conductive pads, and the driving circuit board bonded to a second conductive pad in the second conductive pads.

In yet another aspect, a functional backplane is provided. The functional backplane includes a substrate, conductive pads, an oxidation protective layer, second plating layers, intermetallic compound layers, conductive connection lay-ers and electronic components. The conductive pads are disposed on the substrate. The oxidation protective layer, a second plating layer, an intermetallic compound layer and a conductive connection layer are stacked in a direction per-pendicular to the substrate and directed from the substrate to a conductive pad in the conductive pads. A material of the oxidation protective layer includes a nickel-palladium-based alloy. Each electronic component is electrically connected to the conductive connection layer.

In yet another aspect, a backlight module is provided. The backlight module includes the functional backplane as described in any one of the above embodiments.

In yet another aspect, a display apparatus is provided. The display apparatus includes a display panel and the backlight module as described in the above embodiments. The display panel is disposed at a light-exit side of the backlight module.

In yet another aspect, a display panel is provided. The display panel includes: the functional backplane as described in any one of the above embodiments.

In yet another aspect, a display apparatus is provided. The display apparatus includes the display panel as described in the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
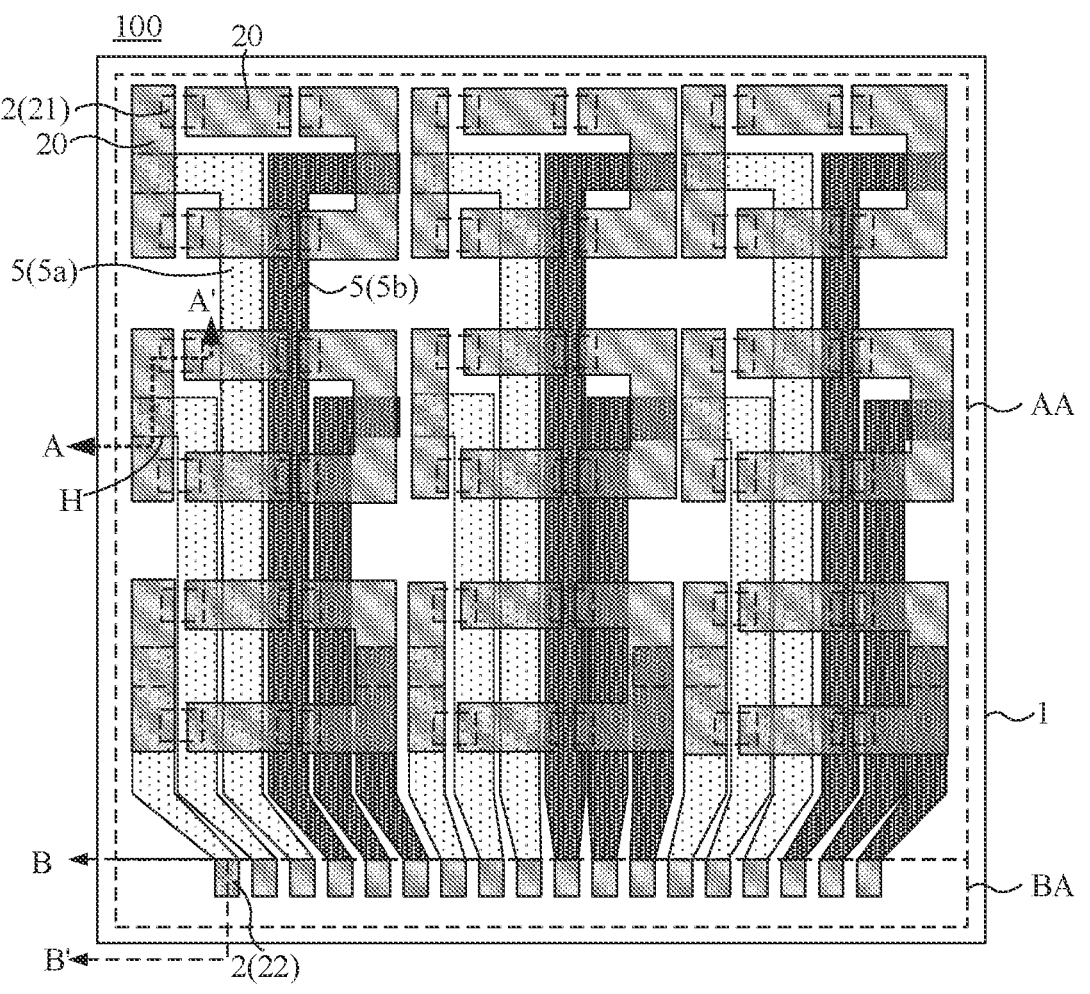
FIG. 1 is a structural diagram of a wiring board, in accordance with some embodiments.

Technical solutions in some embodiments of the present disclosure will be described clearly and completely with reference to the accompanying drawings below. Obviously, the described embodiments are merely some but not all embodiments of the present disclosure. All other embodi-ments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "com-prises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Sche-matic representation of the above terms does not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "connected" and derivatives thereof may be used. For example, the term "electrically connected" may be used in the description of some embodiments to indicate that two or more components are in direct physical contact or electrical contact with each other.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" used herein means an open and inclusive expression, which does not exclude devices that are configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art in view of measurement in question and errors associated with measurement of a particular quantity (i.e., the limitations of the measurement system).

As used herein, the term such as "parallel", "perpendicular", or "equal" includes a stated condition and a condition similar to the stated condition. A range of the similar condition is within an acceptable range of deviation, and the acceptable range of deviation is determined by a person of ordinary skill in the art in view of measurement in question and errors associated with measurement of a particular quantity (i.e., the limitations of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

The "same layer" mentioned herein refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses. On the contrary, "different layers" refer to layer structures, which are formed by forming film layers for forming specific patterns by using respective film forming processes, and then performing patterning process by using respective masks. For example, a description that "two layer structures are arranged in different layers" means that the two layer structures are formed in respective process steps (each including a film forming process and a patterning process).

Exemplary embodiments are described herein with reference to sectional views and/or plan views as idealized exemplary accompanying drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown to have a rectangle shape generally has a feature of being curved. Therefore, the regions shown in the accompanying drawings are schematic in nature, and their shapes are not intended to show actual shapes of regions in an apparatus, and are not intended to limit the scope of the exemplary embodiments.

The surface mounted technology (SMT) is one of the most popular technologies and processes in the electronic assembly industry. SMT is a technology in which an electronic component having pins is placed on a surface of a base substrate having circuits and conductive pads (also referred to as pads), and the electronic component is soldered and assembled to the base substrate through a reflow soldering manner or dip soldering manner. In order to complete a fixed connection between the electronic component and the conductive pad, it needs to provide solder on the conductive pad, which is to be electrically connected to the electronic component, of the base substrate, or to provide the solder on the pin of the electronic component; and then the electronic component is aligned with the conductive pad and in contact with the conductive pad. For example, at a high temperature in a range of 230° C. to 260° C., inclusive, the solder is melted to get good wetting, and then is rapidly cooled down to achieve the fixed connection between the electronic component and the conductive pad. The conductive pad is generally made of copper. However, copper is easily oxidized, and therefore the conductive pad needs to be performed a surface treatment. A manner of the surface treatment for the conductive pad includes forming a copper alloy layer on a surface of the conductive pad to prevent oxidation of copper. In this way, the electronic component is directly soldered to a surface of the copper alloy layer by the solder. However, the inventors of the present disclosure have found that, during the reflow soldering, an intermetallic compound (IMC) is formed by the solder and both the copper alloy layer and the conductive pad, and a thickness and composition of the intermetallic compound are in a functional relationship with a time, a temperature and an application condition of the soldering process; in addition, internal stress at a material junction varies according to the thickness and composition of the intermetallic compound (in general, the internal stress gradually increases as the thickness of the intermetallic compound increases), so that a phenomenon of embrittlement and even breakage occurs at a position (solder joint) where the electronic component and the conductive pad are in contact. As a result, a connection intensity and reliability of the two are affected.

During the reflow soldering, the intermetallic compound will be rapidly formed by the solder and both the copper alloy layer and the conductive pad. The solder is in direct contact with the copper alloy layer and the conductive pad, and copper in the copper alloy layer and the conductive pad forms "temporarily stable" intermetallic compounds of a $Cu_xSn_y$ series with tin in the solder, where x in $Cu_xSn_y$ takes a value from 3, 4, 5 and 6, and y in $Cu_xSn_y$ takes a value from 2, 3, 4 and 5. Thicknesses and thickness ratios of these intermetallic compounds of the $Cu_xSn_y$ series vary with a temperature, a time, an environment and a using condition of the soldering process. The $Cu_3Sn_2$ intermetallic compound is located in an area farthest away from the solder, and the $Cu_6Sn_5$ intermetallic compound is located in an area closest to the solder. The $Cu_3Sn_2$ intermetallic compound has poor solderability, and the $Cu_6Sn_5$ intermetallic compound has solderability, but its thickness is small, resulting in a low connection intensity and poor reliability at the solder joint.

In addition, in a case of an insufficient solder or a soldering position shift of the electronic component, a lateral shear force needs to be applied to remove the electronic component, and then the electronic component is re-soldered at a correct position. The conductive pad may be damaged during removal of the electronic component, which causes that the conductive pad cannot be soldered to the electronic component again.

Moreover, a manner of the surface treatment for the conductive pad also includes using an electroless nickel immersion gold (ENIG) process. The base substrate having the circuits and the conductive pads is performed acid pickling first, and then is placed in a solution of which main components are nickel sulfate, sodium hypophosphite (a reducing agent for reducing nickel ions to metallic nickel) and a complexing agent, so that a phosphorus-nickel alloy layer is generated on the surface of the conductive pad. Since the phosphorus-nickel alloy layer is still easily oxidized, it is difficult and unreliable to solder the solder and the oxidized phosphorus-nickel alloy layer, and thus the base substrate finally needs to be immersed in a solution containing gold ions to form a gold immersion layer on a surface of the phosphorus-nickel alloy layer. Gold particles in the gold immersion layer can fill voids in the phosphorus-nickel alloy layer to reduce probability of oxidation of the phosphorus-nickel alloy layer, so as to weaken a degree of oxidation of the conductive pad. In this way, the electronic component is directly soldered on the surface of the phosphorus-nickel alloy layer by the solder. However, the inventors of the present disclosure have found that the following phenomena exist in the ENIG process.

(1) A mass proportion of phosphorus in the phosphorus-nickel alloy layer affects the quality of the base substrate. For example, in a case where the mass proportion of phosphorus in the phosphorus-nickel alloy layer is less than 7% or greater than 11%, the quality of the base substrate is poor; and in a case where the mass proportion of phosphorus in the phosphorus-nickel alloy layer is greater than or equal to 7% and less than or equal to 11%, the quality of the base substrate is good. And the mass proportion of phosphorus in the phosphorus-nickel alloy layer is related to a content of phosphorus in the solution of which the main components are nickel sulfate, sodium hypophosphite and the complexing agent, but the content of phosphorus in the solution during the ENIG process is changing (a content of sodium hypophosphite is reducing), resulting in a change in the mass proportion of phosphorus in the phosphorus-nickel alloy layer. Therefore, it needs to ensure the content of phosphorus in the solution by adjusting or replacing the solution, which increases the difficulty of the ENIG process.

(2) The phosphorus-nickel alloy layer needs to be set with a large thickness. A structure of the phosphorus-nickel alloy layer is in a shape of a sheet in a direction of a plane where the phosphorus-nickel alloy layer is located, which causes that a void ratio of the phosphorus-nickel alloy layer is relatively large. Therefore, the phosphorus-nickel alloy layer needs to be set with the large thickness. For example, the thickness of the phosphorus-nickel alloy layer is greater than or equal to 3 μm (in a case where the phosphorus-nickel alloy layer is applied in the field in which high reliability is required, the thickness of the phosphorus-nickel alloy layer should be greater than or equal to 5 μm), so as to avoid formation of an intermetallic compound due to diffusion of tin in the solder (and gold in the gold immersion layer, which will be described below) and copper in the conductive pad, thereby avoiding damage of the conductive pad during the removal of the electronic component. However, if the phosphorus-nickel alloy layer is too thick, it is not conducive to an application thereof in the field in which high frequency is required (characteristic impedance control field).

(3) Covering of the gold immersion layer will affect the appearance and quality of the base substrate. As mentioned above, the solution during the ENIG process is unstable and the void ratio of the phosphorus-nickel alloy layer is relatively large, and an atomic radius of the gold particles in the gold immersion layer is relatively large. If the base substrate is immersed in the gold ion solution for a short time, a thickness of the gold immersion layer will be relatively small. For example, in a case where the thickness of the gold immersion layer is less than or equal to 0.03 μm, the gold particles in the gold immersion layer cannot fill the voids in the phosphorus-nickel alloy layer, and the gold immersion layer cannot cover the phosphorus-nickel alloy layer, resulting in oxidation of the phosphorus-nickel alloy layer. For example, "dark dot" or "black patch" is formed or change in color (whitening) occurs on the phosphorus-nickel alloy layer. Thus, the appearance of the base substrate and the reliability of soldering will be affected. In addition, an intermetallic compound will be formed due to the diffusion of gold in the gold immersion layer and copper in the conductive pad, and gold can inter-diffuse with copper through the voids in the phosphorus-nickel alloy layer, so that the conductive pad will be damaged during the removal of the electronic component.

(4) The ENIG process includes an acid pickling step, through which an oxidized portion of the surface of the conductive pad can be removed, but a non-oxidized portion of the conductive pad will also be corroded during the acid pickling, resulting in the loss of a portion of the conductive pad. Moreover, the ENIG process has a high cost and causes great pollution to the environment.

Figure 2A:
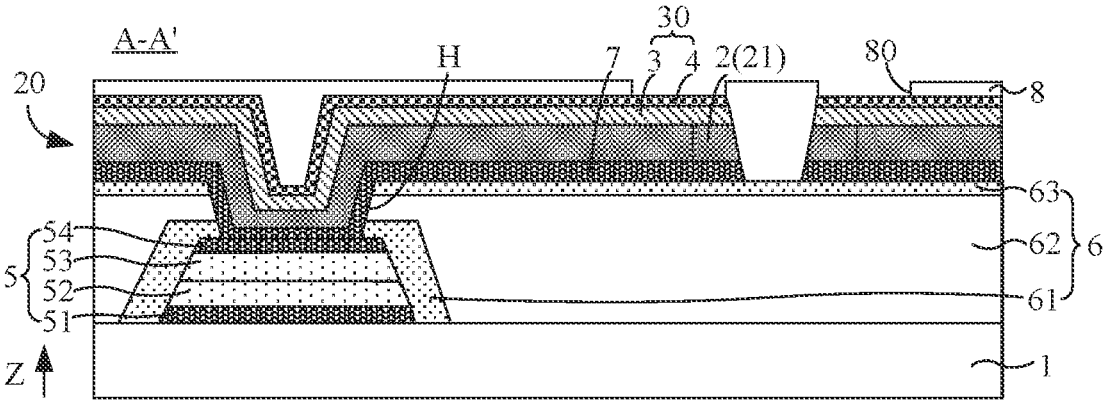
FIG. 2A is a sectional view of the wiring board in FIG. 1 taken along the section line A-A'.
Figure 2B:
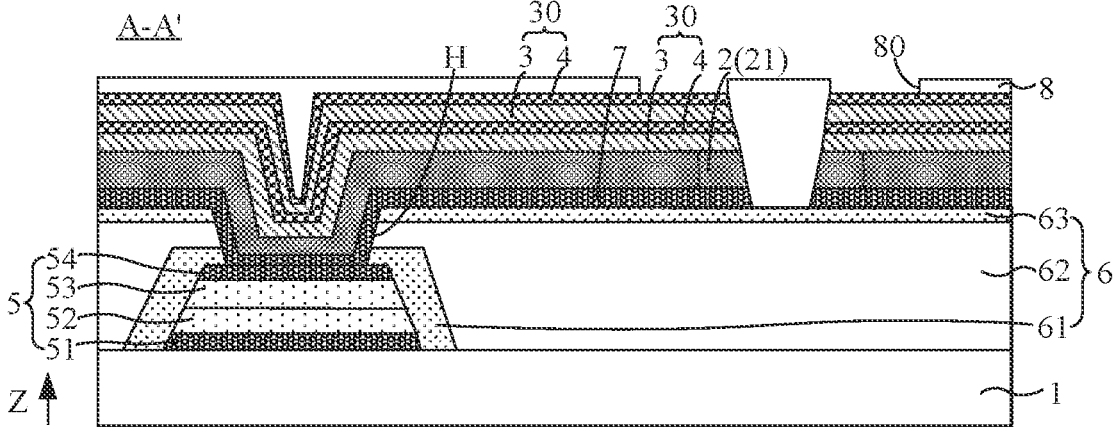
FIG. 2B is another sectional view of the wiring board in FIG. 1 taken along the section line A-A'.
Figure 2C:
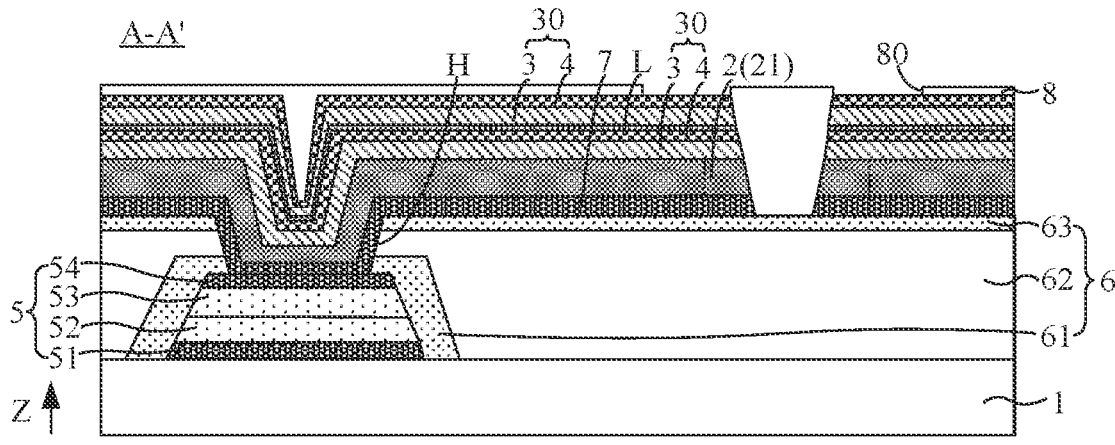
FIG. 2C is yet another sectional view of the wiring board in FIG. 1 taken along the section line A-A'.
Figure 3:
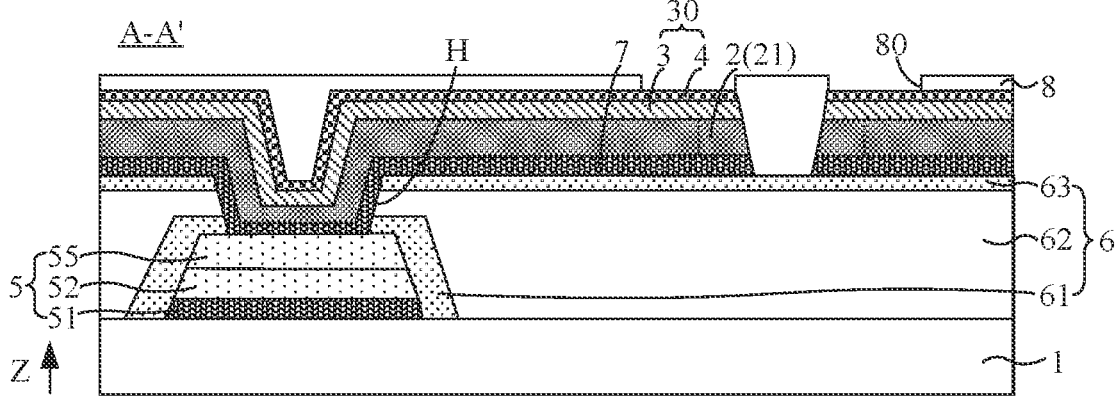
FIG. 3 is yet another sectional view of the wiring board in FIG. 1 taken along the section line A-A'.

In order to solve the above problems, as shown in FIGS. 1 to 3, some embodiments of the present disclosure provide a wiring board 100. The wiring board 100 includes a substrate 1, conductive pads 2 and at least one protective layer group 30.

For example, a material of the substrate 1 may be selected from anyone of plastic, an FR-4 material, resin, glass, quartz, polyimide, polymethyl methacrylate (PMMA), etc.

As shown in FIGS. 2A to 3, the conductive pad 2 is disposed on the substrate 1, and the conductive pad 2 is configured to be electrically connected to an electronic component to transmit an electrical signal to the electronic component.

For example, a material of the conductive pad 2 includes copper.

As shown in FIGS. 2A to 3, the at least one protective layer group 30 is disposed on a side of the conductive pads 2 away from the substrate 1. The protective layer group includes an oxidation protective layer 3 and a palladium alloy layer 4 that are stacked, and the oxidation protective layer 3 is closer to the substrate 1 than the palladium alloy layer 4. A material of the oxidation protective layer 3 includes a nickel-based alloy, which has good adhesion to copper, and the oxidation protective layer 3 can function to prevent oxidation of the conductive pad 2 and protect the conductive pad 2.

It will be noted that the "nickel-based alloy" refers to an alloy in which nickel serves as a base metal and other metal(s) are doped in the base metal.

For example, the nickel-based alloy includes one or more of a nickel-palladium alloy, a nickel-copper alloy, a nickel-tungsten alloy, a nickel-aluminum alloy, a nickel-titanium alloy, a nickel-vanadium alloy, a nickel-zirconium alloy, a nickel-gold alloy, a nickel-yttrium alloy, a nickel-niobium alloy, a nickel-platinum alloy, a nickel-tin alloy, a nickel-silver alloy and a nickel-tantalum alloy.

As shown in FIGS. 2A to 3, the palladium alloy layer 4 is disposed on a side of the oxidation protective layer 3 away from the substrate 1.

It will be noted that the "palladium alloy layer 4" refers to an alloy in which palladium serves as a base metal and a minute amount of other metal(s) are doped in the base metal, and the minute amount of other metal(s) are negligible. An atomic radius of palladium in the palladium alloy layer 4 is relatively small, and it is easy for palladium to fill voids in the oxidation protective layer 3 (the nickel-based alloy) and to cover a surface of the oxidation protective layer 3. The palladium alloy layer 4 may serve as a dense protective layer for the oxidation protective layer 3.

In addition, the conductive pads 2, the oxidation protective layer 3 and the palladium alloy layer 4 may each be formed by using a magnetron sputtering process, which avoids corresponding problems caused by using the ENIG process.

In the wiring board 100 provided in the embodiments of the present disclosure, the atomic radius of palladium in the palladium alloy layer 4 is relatively small, and it is easy for palladium to fill the voids in the oxidation protective layer 3 (the nickel-based alloy) and to cover the surface of the oxidation protective layer 3. The palladium alloy layer 4 may serve as the dense protective layer for the oxidation protective layer 3.

In a process of fixedly connecting the electronic component to the conductive pad by solder, the solder may form an intermetallic compound with the palladium alloy layer 4, and the palladium alloy layer 4 may prevent the solder from being in contact with the conductive pad 2 through the voids in the oxidation protective layer 3, which avoids formation of an intermetallic compound between the solder and the conductive pad 2. Since a shear strength of the intermetallic compound is less than shear strengths of the solidified solder, the palladium alloy layer 4, the oxidation protective layer 3 and the conductive pad 2, during the removal of the electronic component, the electronic component is disconnected at a position where the intermetallic compound is located, and a portion of the palladium alloy layer 4 may be removed together, but the conductive pad 2 will not be removed together. Thus, it avoids the damage of the conductive pad 2, which facilitates re-soldering of the electronic component to the conductive pad 2, enhances the re-repairing capability of the wiring board 100 and increases the re-repairing times (repairing rate) of the wiring board 100, reduces a scrap rate of the wiring board 100, and improves a cumulative yield (Cum yield).

In addition, a melting point of palladium is relatively high (the melting point of palladium is 1552° C., which is about 500° C. higher than a melting point of gold), and palladium also has a non-oxidizing effect and high stability. Therefore, the palladium alloy layer 4 may prevent oxidation of the nickel-based alloy in the oxidation protective layer 3.

Moreover, in the process of fixedly connecting the electronic component to the conductive pad by the solder, the palladium alloy layer 4 that serves as the dense protective layer for the oxidation protective layer 3 may prevent the solder from being in contact with the conductive pad 2 through the voids in the oxidation protective layer 3. Therefore, the oxidation protective layer 3 does not need to be set with a large thickness for blocking the solder, and the palladium alloy layer 4 with a small thickness may form a dense protection for the oxidation protective layer 3, which is beneficial to reducing a material cost of the wiring board 100, and is beneficial to the application of the wiring board 100 in the field of high-frequency circuits.

In some embodiments, as shown in FIGS. 2B and 2C, the wiring board 100 includes a plurality of protective layer groups 30 stacked on the side of the conductive pads 2 away from the base 1.

It will be understood that, in the process of fixedly connecting the electronic component to the conductive pad by the solder, the solder may form an intermetallic compound with the palladium alloy layer 4 in an uppermost protective layer group 30, and the plurality of protective layer groups 30 may enhance a blocking effect on the solder, which avoids the formation of the intermetallic compound between the solder and the conductive pad 2.

In addition, during the removal of the electronic component, the electronic component is disconnected at the position where the intermetallic compound is located, a portion of the palladium alloy layer 4 in the uppermost protective layer group 30 may be removed together, and the oxidation protective layer 3 under the palladium alloy layer 4 in the uppermost protective layer group 30 and other protective layer groups 30 are retained. In a process of re-soldering the electronic component, solder may form an intermetallic compound with the oxidation protective layer 3. It will be seen that, by providing the plurality of protective layer groups 30 on the conductive pads 2, the electronic component may be removed and re-soldered multiple times without damaging the conductive pad 2, which further enhances the re-repairing capability of the wiring board 100 and increases the re-repairing times of the wiring board 100.

In some embodiments, as shown in FIG. 2C, the wiring board 100 further includes a protective pad layer L disposed between two adjacent protective layer groups 30.

For example, a material of the protective pad layer L may include copper.

For example, a thickness of the protective pad layer L is in a range of 3000 Å to 6000 Å, such as 3000 Å, 4000 Å, 4500 Å, 5000 Å or 6000 Å.

It will be understood that, in the process of fixedly connecting the electronic component to the conductive pad by the solder, the protective pad layer L may further enhance the blocking effect on the solder, which avoids the formation of the intermetallic compound between the solder and the conductive pad 2.

Moreover, even if a high temperature causes the protective layer group 30 located on the protective pad layer L to be melted during the reflow soldering, the solder and the protective pad layer L may also form an intermetallic compound. Thus, during the removal of the electronic component, the electronic component is disconnected at the position where the intermetallic compound is located, a portion of the protective pad layer L may be removed together, and the protective layer group 30 located under the protective pad layer L is retained. In the process of re-soldering the electronic component, the solder may form an intermetallic compound with the protective layer group 30 located under the protective pad layer L, which enhances the re-repairing capability of the wiring board 100 and increases the re-repairing times of the wiring board 100.

In some embodiments, as shown in FIG. 2A, a thickness of the oxidation protective layer 3 is in a range of 0.5 μm to 1.45 μm. For example, the thickness of the oxidation protective layer 3 is 0.5 μm, 0.7 μm, 0.9 μm, 1.3 μm or 1.45 μm.

In the related art, only in a case where the thickness of the phosphorus-nickel alloy layer is greater than or equal to 3 μm, can the solder be effectively prevented from being in contact with the conductive pad through the voids in the phosphorus-nickel alloy layer. However, in the embodiments of the present disclosure, the palladium alloy layer 4 serves as the dense protective layer for the oxidation protective layer 3, and the thickness of the oxidation protective layer 3 is close to 1 μm, which reduces the thickness and the material cost of the oxidation protective layer 3, and facilitates the application of the wiring board 100 in the field of high-frequency circuits.

In some embodiments, as shown in FIG. 2A, in the material of the oxidation protective layer 3, a mass proportion of nickel is in a range of 40% to 95%. For example, the mass proportion of nickel is 40%, 60%, 67.5%, 80% or 95%.

The inventors of the present disclosure have found through experiments that, in the material of the oxidation protective layer 3, in the case where the mass proportion of nickel is in the range of 40% to 95%, the oxidation protective layer 3 has good oxidation resistance to prevent oxidation of the conductive pad 2.

In some embodiments, as shown in FIG. 2A, a thickness of the palladium alloy layer 4 is in a range of 0.05 μm to 0.1 μm. For example, the thickness of the palladium alloy layer 4 is 0.05 μm, 0.06 μm, 0.075 μm, 0.08 μm or 0.1 μm.

It will be understood that, the atomic radius of palladium in the palladium alloy layer 4 is smaller than an atomic radius of gold, and thus it is easy for palladium to fill the voids in the oxidation protective layer 3 (the nickel-based alloy) and to cover the surface of the oxidation protective layer 3. Therefore, the palladium alloy layer 4 may be set relatively thin. For example, the thickness of the palladium alloy layer 4 is at least 0.05 μm, in which case the oxidation protective layer 3 may be densely protected. As a result, it is beneficial to apply the wiring board 100 to the field of high-frequency circuits. In addition, a specific gravity of palladium is less than a specific gravity of gold, and a price of palladium is approximately half of a price of gold. Therefore, compared with a case where a gold immersion layer is formed on the surface of the oxidation protective layer 3, a material cost of the palladium alloy layer 4 is lower than a material cost of the gold immersion layer.

In some embodiments, as shown in FIG. 2A, a sum of the thickness of the oxidation protective layer 3 and the thickness of the palladium alloy layer 4 is in a range of 0.6 μm to 1.5 μm, inclusive.

For example, the sum of the thickness of the oxidation protective layer 3 and the thickness of the palladium alloy layer 4 is 0.6 μm, 0.8 μm, 1 μm, 1.3 μm or 1.5 μm.

In the embodiments of the present disclosure, the oxidation protective layer 3 and the palladium alloy layer 4 may function to protect the conductive pad 2 and prevent the conductive pad 2 from being oxidized. In a process of the removal of the electronic component after the electronic component is soldered, the oxidation protective layer 3 and the palladium alloy layer 4 may protect the conductive pad 2 from being damaged. In addition, the sum of the thickness of the oxidation protective layer 3 and the thickness of the palladium alloy layer 4 is small, which is beneficial to reducing the material cost of the wiring board 100 and is beneficial to the application of the wiring board 100 in the field of high-frequency circuits.

Figure 5:
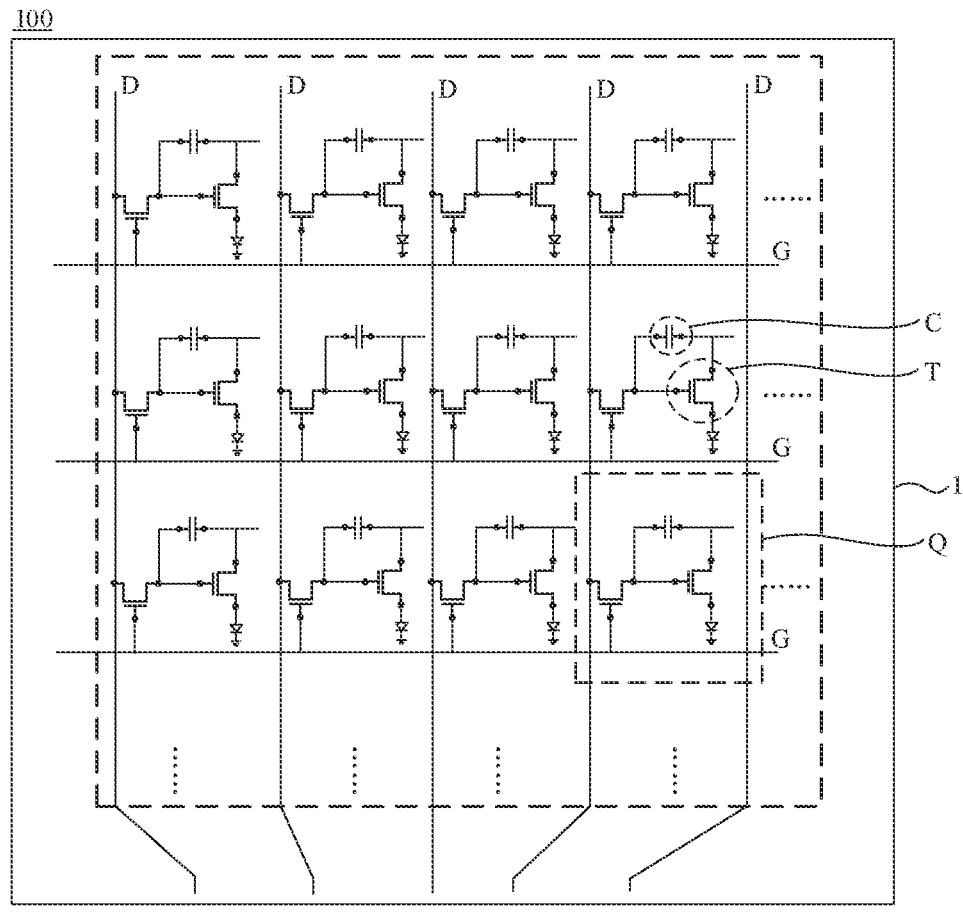
FIGS. 5 and 6 are structural diagrams of another wiring board, in accordance with some embodiments.

In some embodiments, as shown in FIG. 5, the wiring board 100 further includes driving circuits Q disposed on the substrate 1. That is, the wiring board 100 is an active circuit board.

It will be understood that, referring to FIG. 5, the wiring board 100 includes a plurality of gate lines G and a plurality of data lines D that are disposed on the substrate 1. A driving circuit Q is electrically connected to a gate line G and a data line D. Under control of a gate scanning signal from the gate line G, the driving circuit Q receives a data signal from the data line D and then outputs a driving signal.

For example, as shown in FIG. 5, the driving circuit Q is a 2T1C driving circuit. That is, the driving circuit Q includes two thin film transistors T and a capacitor C.

Figure 6:
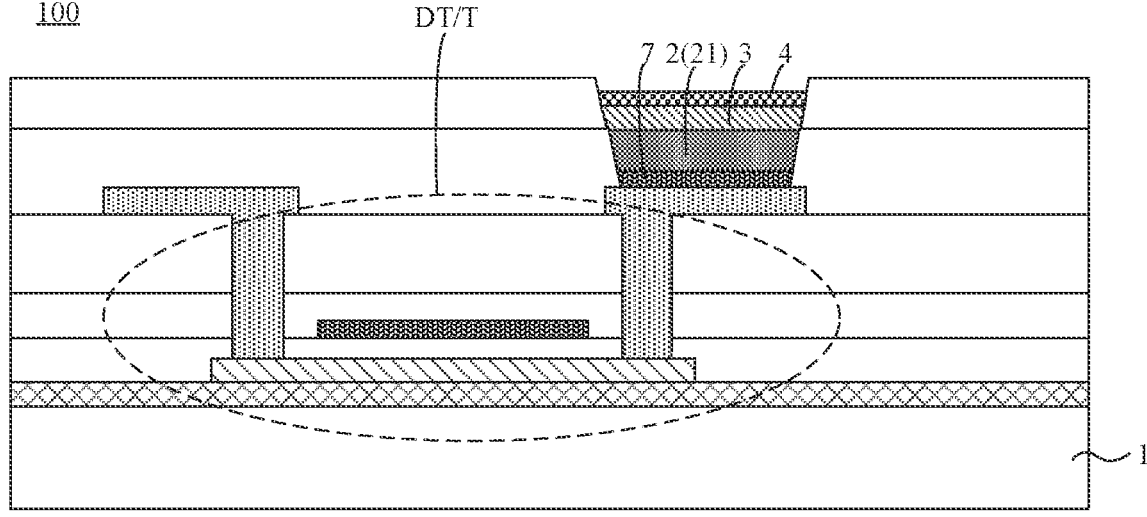

As shown in FIG. 6, the driving circuit Q is located between the substrate 1 and a conductive pad 2, and the conductive pad 2 is electrically connected to the driving circuit Q.

It will be understood that, FIG. 6 shows a driving transistor DT in thin film transistors T of the driving circuit Q, the driving transistor DT is located between the substrate 1 and the conductive pad 2, and the conductive pad 2 is electrically connected to the driving transistor DT. The driving transistor DT in the driving circuit Q outputs the driving signal, which may be transmitted to the electronic component through the conductive pad 2.

In some embodiments, as shown in FIGS. 1 and 2A, the wiring board 100 further includes traces 5 disposed on the substrate 1, and the conductive pads 2 are located on a side of the traces 5 away from the substrate 1 and a conductive pad 2 is electrically connected to a trace 5.

It will be understood that the wiring board 100 shown in FIG. 1 is a passive circuit board, and no driving circuit is provided in the wiring board 100. The trace 5 receives a driving signal from the outside and transmits the driving signal to the electronic component through the conductive pad 2.

For example, as shown in FIG. 1, the trace 5 includes anode traces 5*a* and cathode traces 5*b*.

In some embodiments, as shown in FIGS. 2A to 2C and 4, the trace 5 includes a first adhesive layer 51, a first conductive layer 52, a second conductive layer 53 and an anti-oxidation conductive layer 54 that are stacked. In a direction Z perpendicular to the substrate 1 and directed from the substrate 1 to the protective layer group 30, the first adhesive layer 51, the first conductive layer 52, the second conductive layer 53 and the anti-oxidation conductive layer 54 are arranged in sequence.

For example, a material of the first adhesive layer 51 includes one or more of a molybdenum alloy, a titanium alloy, a tungsten alloy, a nickel alloy, a molybdenum-based alloy and a nickel-based alloy. The molybdenum-based alloy may include a molybdenum-niobium alloy, a molybdenum-titanium alloy, a molybdenum-tungsten alloy or a molybde-num-tantalum alloy. The nickel-based alloy may include a copper-nickel-palladium alloy, a nickel-palladium alloy, a tungsten-nickel-palladium alloy, a nickel-aluminum-palla-dium alloy or a nickel-titanium-palladium alloy.

For example, a thickness of the first adhesive layer 51 is in a range of 200 Å to 600 Å, such as 200 Å, 300 Å, 400 Å, 500 Å or 600 Å.

By using the magnetron sputtering process, the first adhesive layer 51 is formed on the substrate 1. The first adhesive layer 51 may be used to adhere the first conductive layer 52 and the second conductive layer 53 to the substrate 1, thereby enhancing an adhesive strength between the substrate 1 and both the first conductive layer 52 and the second conductive layer 53.

For example, materials of the first conductive layer 52 and the second conductive layer 53 each include copper.

For example, a sum of a thickness of the first conductive layer 52 and a thickness of the second conductive layer 53 is in a range of 1 μm to 5 μm, such as 1 μm, 2 μm, 3 μm, 4 μm or 5 μm.

By using the magnetron sputtering process, two conductive layers are sequentially formed on a side of the first adhesive layer 51 away from the substrate 1, and the two conductive layers are patterned to form the first conductive layer 52 and the second conductive layer 53. The first conductive layer 52 and the second conductive layer 53 together serve as a main portion of the trace 5.

For example, a material of the anti-oxidation conductive layer 54 includes one or more of a molybdenum alloy, a titanium alloy, a tungsten alloy, a nickel alloy, a molybdenum-based alloy and a nickel-based alloy. The molybdenum-based alloy may include a molybdenum-niobium alloy, a molybdenum-titanium alloy, a molybdenum-tungsten alloy or a molybdenum-tantalum alloy. The nickel-based alloy may include a copper-nickel-palladium alloy, a nickel-palladium alloy, a tungsten-nickel-palladium alloy, a nickel-aluminum-palladium alloy or a nickel-titanium-palladium alloy.

By using the magnetron sputtering process, the anti-oxidation conductive layer 54 is formed on a side of the second conductive layer 53 away from the substrate 1. The anti-oxidation conductive layer 54 may prevent the second conductive layer 53 from being oxidized.

In some embodiments, as shown in FIG. 3, the trace 5 includes the first adhesive layer 51, the first conductive layer 52 and an electroplated metal layer 55 that are stacked. In the direction Z perpendicular to the substrate 1 and directed from the substrate 1 to the protective layer group 30, the first adhesive layer 51, the first conductive layer 52 and the electroplated metal layer 55 are arranged in sequence.

For example, the thickness of the first adhesive layer 51 is in a range of 200 Å to 600 Å, such as 200 Å, 300 Å, 400 Å, 500 Å or 600 Å.

By using the magnetron sputtering process, the first adhesive layer 51 is formed on the substrate 1. The first adhesive layer 51 may be used to adhere the first conductive layer 52 to the substrate 1, thereby enhancing an adhesive strength between the first conductive layer 52 and the substrate 1.

For example, a material of the first conductive layer 52 includes copper.

For example, a thickness of the first conductive layer 52 is in a range of 2500 Å to 4000 Å, such as 2500 Å, 3000 Å, 3250 Å, 3500 Å or 4000 Å.

For example, a material of the electroplated metal layer 55 includes copper.

For example, a thickness of the electroplated metal layer 55 is in a range of 1 μm to 5 μm, such as 1 μm, 2 μm, 3 μm, 4 μm or 5 μm.

By using the magnetron sputtering process, a conductive layer is formed on a side of the first adhesive layer 51 away from the substrate 1; by using an electroplating process, another conductive layer is formed on a side of the conductive layer away from the substrate 1; and the conductive layer and the another conductive layer are patterned to form the first conductive layer 52 and the electroplated metal layer 55, respectively. The first conductive layer 52 and the electroplated metal layer 55 together serve as a main portion of the trace 5.

In some embodiments, as shown in FIGS. 1 to 3, the wiring board 100 further includes at least one insulating layer 6 covering the traces 5. The conductive pad 2 is electrically connected to the trace 5 through a via hole H penetrating through the at least one insulating layer 6.

It will be noted that, referring to FIGS. 1 and 2A, the wiring board 100 further includes connection lines 20. The connection lines 20 and the conductive pads 2 are made of a same material and are disposed in a same layer. A conductive pad 2 is electrically connected to a connection line 20, and the connection line 20 is electrically connected to the trace 5 through the via hole H penetrating through the at least one insulating layer 6. As a result, the conductive pad 2 is electrically connected to the trace 5.

For example, as shown in FIGS. 2A to 3, the at least one insulating layer 6 includes a first passivation layer 61, a planarization layer 62 and a second passivation layer 63 that are stacked. In the direction Z perpendicular to the substrate 1 and directed from the substrate 1 to the protective layer group 30, the first passivation layer 61, the planarization layer 62 and the second passivation layer 63 are arranged in sequence.

For example, materials of the first passivation layer 61 and the second passivation layer 63 each include silicon nitride.

For example, a thickness of the first passivation layer 61 is in a range of 1000 Å to 4000 Å, such as 1000 Å, 2000 Å, 2500 Å, 3000 Å or 4000 Å; and a thickness of the second passivation layer 63 is in a range of 1000 Å to 4000 Å, such as 1000 Å, 2000 Å, 2500 Å, 3000 Å or 4000 Å.

For example, the first passivation layer 61 and the second passivation layer 63 may each be formed by using a chemical vapor deposition (CVD) process.

For example, a material of the planarization layer 62 includes resin.

In some embodiments, as shown in FIGS. 1 to 3, the wiring board 100 further includes a third passivation layer 8 located at a side of the second passivation layer 63 away from the substrate 1. The third passivation layer 8 has openings 80, and the opening 80 exposes a portion of the palladium alloy layer 4 located on the conductive pad 2, so that the electronic component is soldered.

For example, a material of the third passivation layer 8 includes silicon nitride.

For example, a thickness of the third passivation layer 8 is in a range of 1000 Å to 9000 Å, such as 1000 Å, 3000 Å, 5000 Å, 7000 Å or 9000 Å.

For example, the third passivation layer 8 may be formed by using the CVD process.

In some embodiments, as shown in FIGS. 1 to 4, the wiring board 100 further includes a second adhesive layer 7 disposed between the traces 5 and the conductive pads 2. The conductive pad 2 is electrically connected to the trace 5 through a portion of the second adhesive layer 7.

It will be noted that, referring to FIGS. 1 and 2A, the conductive pad 2 and the connection line 20 are made of the same material and are disposed in the same layer, and the connection line 20 is electrically connected to the trace 5 through the portion of the second adhesive layer 7, so that the conductive pad 2 is electrically connected to the trace 5.

For example, a material of the second adhesive layer 7 includes one or more of a molybdenum alloy, a titanium alloy, a tungsten alloy, a nickel alloy, a molybdenum-based alloy and a nickel-based alloy. The molybdenum-based alloy may include a molybdenum-niobium alloy, a molybdenum-titanium alloy, a molybdenum-tungsten alloy or a molybdenum-tantalum alloy. The nickel-based alloy may include a copper-nickel-palladium alloy, a nickel-palladium alloy, a tungsten-nickel-palladium alloy, a nickel-aluminum-palladium alloy or a nickel-titanium-palladium alloy.

For example, a thickness of the second adhesive layer 7 is in a range of 100 Å to 3000 Å, such as 100 Å, 1000 Å, 1550 Å, 2000 Å or 3000 Å.

By using the magnetron sputtering process, the second adhesive layer 7 is formed on the side of the traces 5 away from the substrate 1. The second adhesive layer 7 may be used to bond the conductive pad 2 to the trace 5 of the wiring board 100, so that a bonding strength between the conductive pad 2 and the trace 5 is enhanced.

In some embodiments, as shown in FIG. 1, the wiring board 100 has a device area AA and a bonding area BA. For example, the bonding area BA is located on a side of the device area AA.

Figure 4:
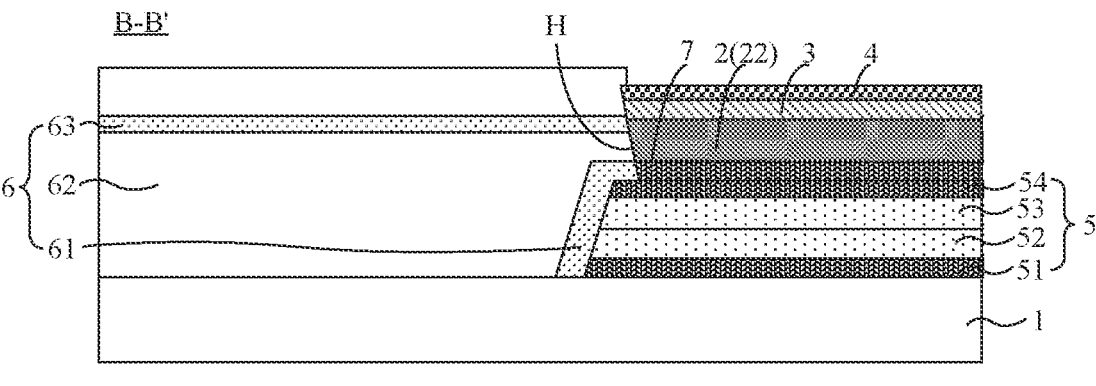
FIG. 4 is a sectional view of the wiring board in FIG. 1 taken along the section line B-B'.

As shown in FIGS. 1, 2A and 4, the conductive pads 2 include first conductive pads 21 disposed in the device area AA, and second conductive pads 22 disposed in the bonding area BA. For example, a first conductive pad 21 is configured to be bonded to a light-emitting device, and a second conductive pad 22 is configured to be bonded to a driving circuit board.

It will be understood that the first conductive pad 21 and the second conductive pad 22 are both electrically connected to a trace 5. The driving circuit board may generate and output a driving signal, and the driving signal is transmitted to the trace 5 through the second conductive pad 22, and then transmitted to the light-emitting device through the trace 5 and the first conductive pad 21.

Figure 7:
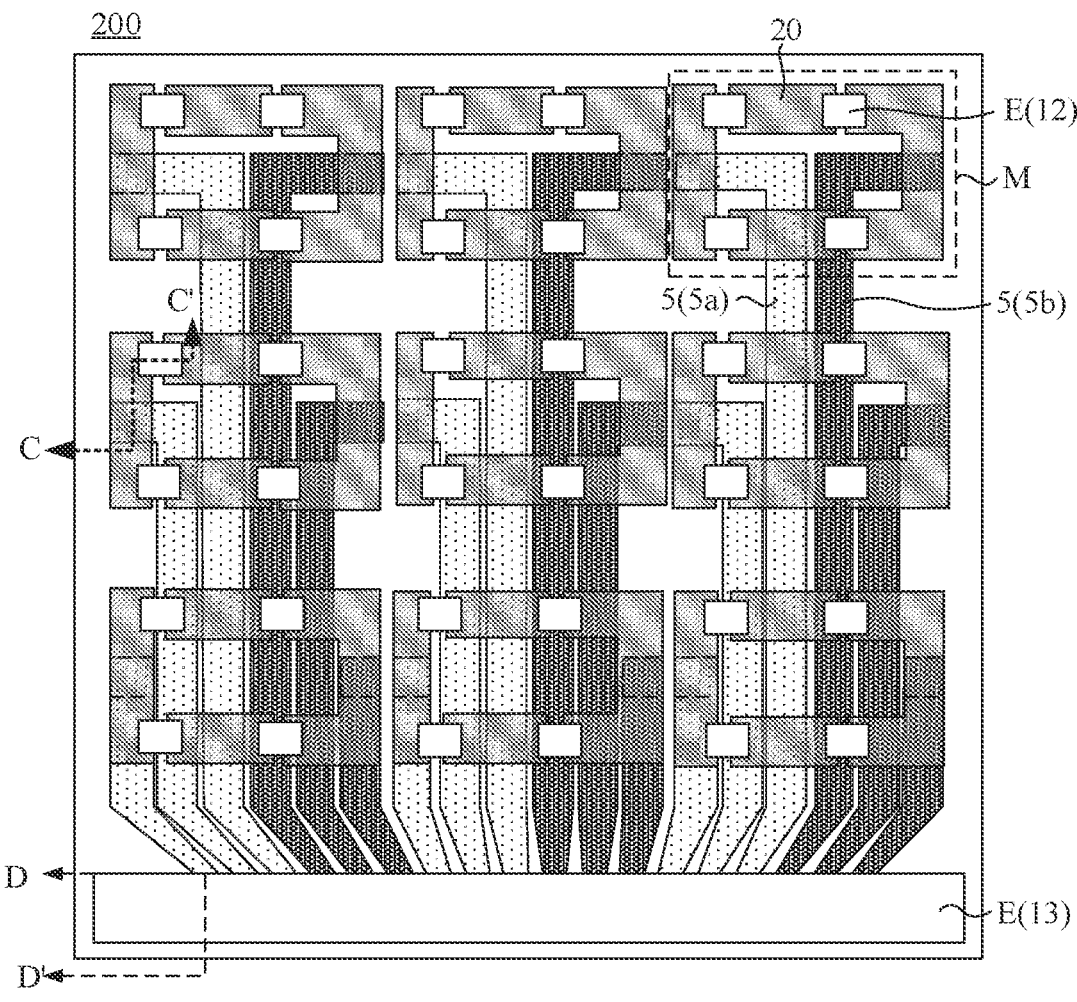
FIG. 7 is a structural diagram of a functional backplane, in accordance with some embodiments.
Figure 8:
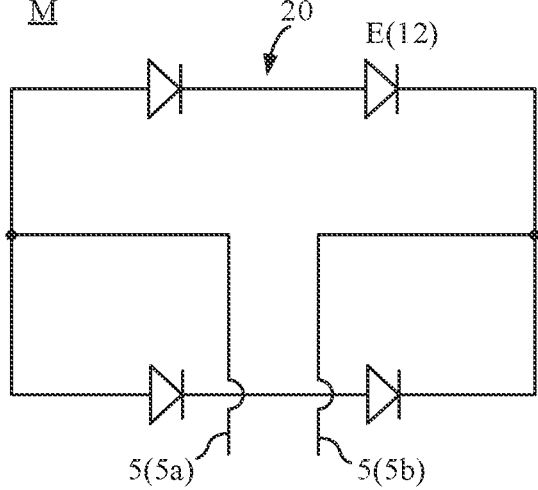
FIG. 8 is an equivalent circuit diagram of the part M in the functional backplane in FIG. 7.
Figure 9:
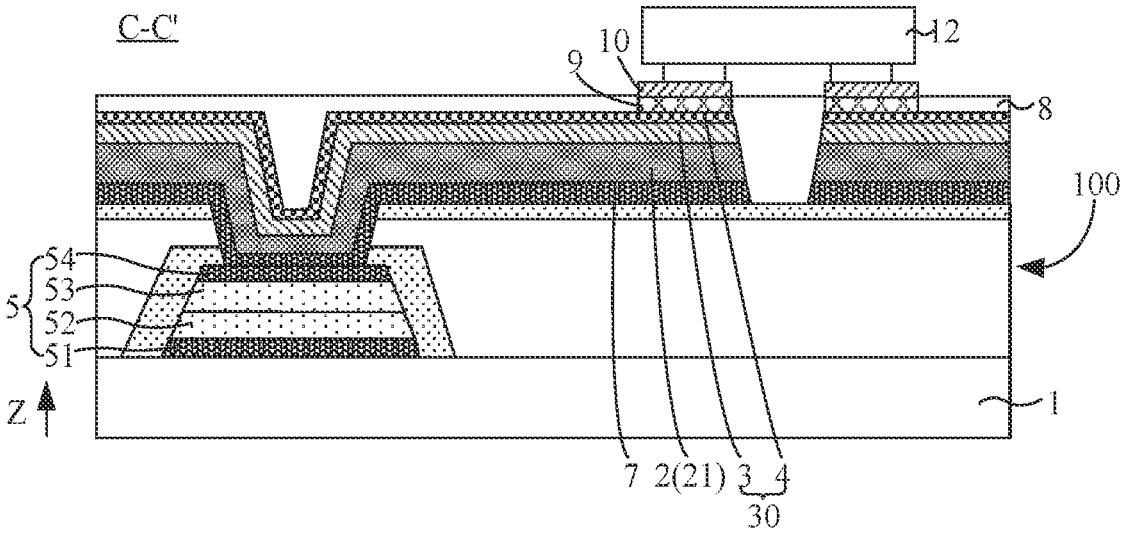
FIG. 9 is a sectional view of the functional backplane in FIG. 7 taken along the section line C-C'.

As shown in FIGS. 7 to 9, some embodiments of the present disclosure provide a functional backplane 200. The functional backplane 200 includes the wiring board 100 in any one of the above embodiments, and intermetallic compound layers 9 and conductive connection layers 10. An intermetallic compound layer 9 and a conductive connection layer 10 are stacked on the wiring board 100 in the direction Z perpendicular to the substrate 1 of the wiring board 100 and directed from the substrate 1 to the protective layer group 30.

As shown in FIGS. 7 to 9, the functional backplane 200 further includes electronic components E, and an electronic component E is electrically connected to the conductive connection layer 10.

For example, the electronic component E includes at least one pin, and the pin of the electronic component E is soldered to the conductive connection layer 10.

For example, the electronic component E may include a miniature integrated circuit, a miniature light-emitting device, a sensor chip or the like.

It will be understood that, in the process of fixedly connecting the electronic component E to the conductive pad by the solder, the solder may form the intermetallic compound layer 9 with a conductive film layer (the palladium alloy layer 4 or the oxidation protective layer 3) located on the conductive pad 2 of the wiring board 100; and moreover, a film layer formed after solidifying of the solder is the conductive connection layer 10. A material of the solder includes at least metallic materials such as tin and silver.

In addition, a shear strength of the intermetallic compound layer 9 is less than a shear strength of the oxidation protective layer 3 of the wiring board 100, and is less than a shear strength of the palladium alloy layer 4 of the wiring board 100.

In the functional backplane 200 provided in the embodiments of the present disclosure, in the process of fixedly connecting the electronic component E to the conductive pad by the solder, the solder may form the intermetallic compound layer 9 with the palladium alloy layer 4 or the oxidation protective layer 3, and the palladium alloy layer 4 and the oxidation protective layer 3 may prevent the solder from being in contact with the conductive pad 2, which avoids the formation of the intermetallic compound between the solder and the conductive pad 2. In this way, since the shear strength of the intermetallic compound layer 9 is small, during the removal of the electronic component E, the electronic component E is disconnected at the intermetallic compound layer 9, and a portion of the palladium alloy layer 4 or the oxidation protective layer 3 may be removed together, but the conductive pad 2 is not removed together. As a result, it avoids the damage of the conductive pad 2, which facilitates re-soldering of the electronic component E to the conductive pad 2, and improves the repairing rate of the functional backplane 200.

Figure 10:
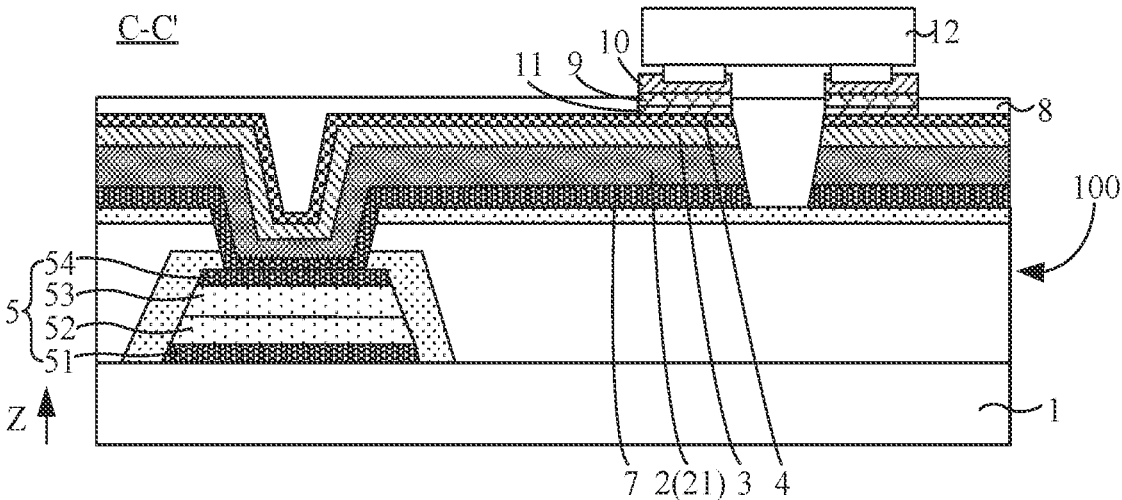
FIG. 10 is another sectional view of the functional back-plane in FIG. 7 taken along the section line C-C', in accordance with some embodiments.

In some embodiments, as shown in FIGS. 9 and 10, the intermetallic compound layer 9 is disposed between the conductive connection layer 10 and the palladium alloy layer 4 of the wiring board 100.

It will be understood that, in the process of fixedly connecting the electronic component E to the conductive pad by the solder, the solder and the palladium alloy layer 4 form the intermetallic compound layer 9, and the palladium alloy layer 4 and the oxidation protective layer 3 may prevent the solder from being in contact with the conductive pad 2, which avoids the formation of the intermetallic compound between the solder and the conductive pad 2.

Figure 11:
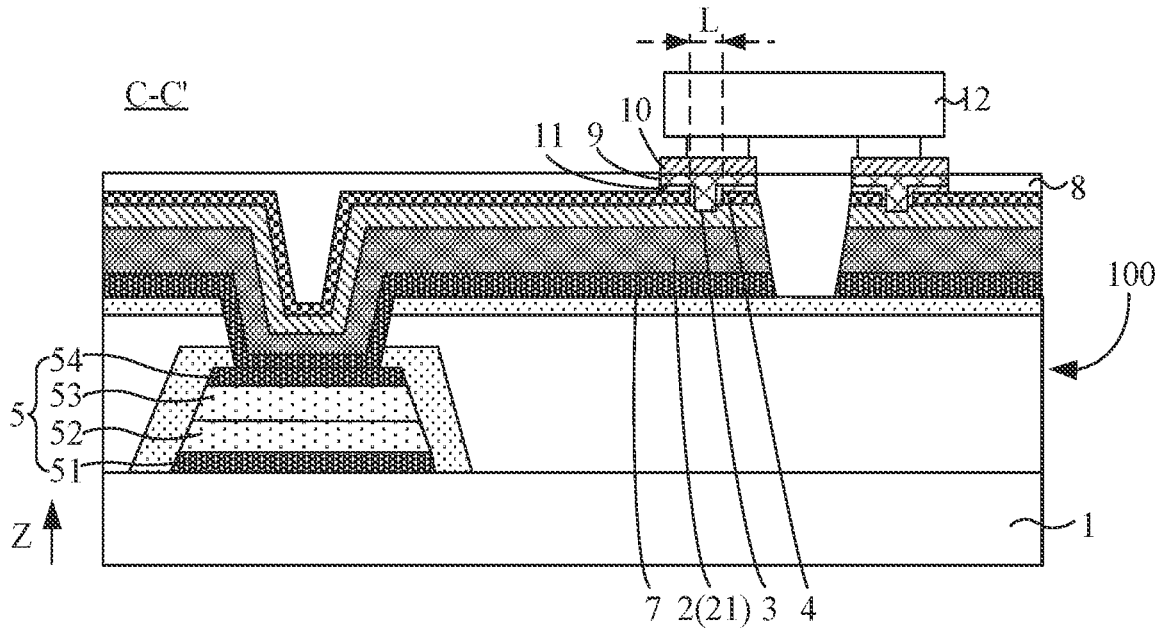
FIG. 11 is yet another sectional view of the functional backplane in FIG. 7 taken along the section line C-C', in accordance with some embodiments.

In some embodiments, as shown in FIG. 11, the palladium alloy layer 4 includes hollowed-out areas L; a portion of the intermetallic compound layer 9 is located between the palladium alloy layer 4 and the conductive connection layer 10, and another portion of the intermetallic compound layer 9 is in contact with the oxidation protective layer 3 of the wiring board 100 through a hollowed-out area L of the palladium alloy layer 4.

It will be understood that, referring to FIG. 11, in the process of fixedly connecting the electronic component E to the conductive pad by the solder, the high temperature causes a portion of the palladium alloy layer 4 to be melted to form the hollowed-out area L, which exposes a portion of the surface of the oxidation protective layer 3. In this case, the solder and an unmelted portion of the palladium alloy layer 4 form an intermetallic compound (i.e., the portion of the intermetallic compound layer 9 located between the palladium alloy layer 4 and the conductive connection layer 10). In addition, the solder may pass through the hollowed-out area L, and form an intermetallic compound with the oxidation protective layer 3. That is, the portion of the intermetallic compound layer 9 passing through the hollowed-out area L of the palladium alloy layer 4 is in contact with the oxidation protective layer 3.

In some embodiments, as shown in FIGS. 10 and 11, the functional backplane 200 further includes first plating layers

11, and a first plating layer 11 is disposed between the palladium alloy layer 4 and the intermetallic compound layer 9.

It will be understood that, referring to FIG. 10, in the process of fixedly connecting the electronic component E to the conductive pad through the solder, the high temperature causes the portion of the palladium alloy layer 4 to be melted, but the palladium alloy layer 4 is not penetrated to form the hollowed-out area, so that the palladium alloy layer 4 does not expose the oxidation protective layer 3. In this case, the solder and the palladium alloy layer 4 form the intermetallic compound layer 9; and the melted portion of the palladium alloy layer 4 forms the first plating layer 11, and the first plating layer 11 is formed between the inter-metallic compound layer 9 and the palladium alloy layer 4.

Referring to FIG. 11, in the process of fixedly connecting the electronic component E to the conductive pad by the solder, the high temperature causes the portion of the palladium alloy layer 4 to be melted to form the hollowed-out area L, which exposes the portion of the surface of the oxidation protective layer 3. In this case, the solder form the intermetallic compound layer 9 with the palladium alloy layer 4 and the oxidation protective layer 3; and the melted portion of the palladium alloy layer 4 forms the first plating layer 11, and the first plating layer 11 is formed between the intermetallic compound layer 9 and the palladium alloy layer 4.

For example, a thickness of the first plating layer 11 is in a range of 0.05 μm to 0.1 μm, such as 0.05 μm, 0.06 μm, 0.075 μm, 0.08 μm or 0.1 μm.

With the above arrangement, the first plating layer 11 is disposed between the palladium alloy layer 4 and the intermetallic compound layer 9, and the first plating layer 11 may also prevent the solder from being in contact with the conductive pad 2, which avoids the formation of the inter-metallic compound between the solder and the conductive pad 2, and may further protect the conductive pad 2.

In some embodiments, as shown in FIGS. 7 to 9, the electronic component E includes the light-emitting device 12. The light-emitting device 12 is bonded to the first conductive pad 21 of the wiring board 100, and the light-emitting device 12 may emit light under driven by the electrical signal from the first conductive pad 12. The light-emitting device 12 may be an LED chip. For example, the light-emitting device 12 may be a mini LED chip or a micro LED chip.

A plurality of light-emitting devices 12 are arranged in an array. For example, every four light-emitting devices 12 are in a group. Referring to an equivalent circuit diagram shown in FIG. 8, four light-emitting devices 12 in a group of light-emitting devices 12 are connected in a "two series and two parallel" manner, where two light-emitting devices 12 are connected in series, and another two light-emitting devices 12 are also connected in series, and the former two light-emitting devices 12 connected in series are connected in parallel with the latter two light-emitting devices 12 connected in series.

As shown in FIGS. 1 and 7, light-emitting devices 12 are electrically connected to each other through the connection line 20.

Figure 12:
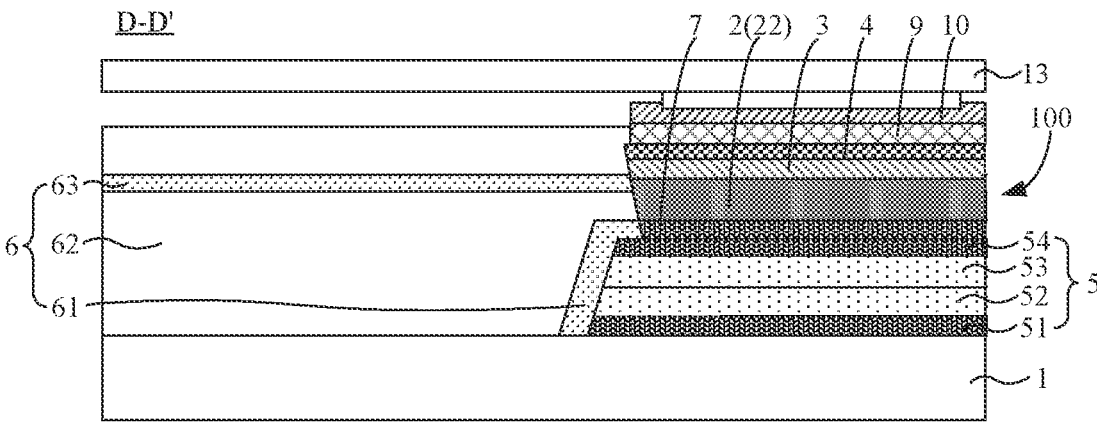
FIG. 12 is a sectional view of the functional backplane in FIG. 7 taken along the section line D-D'.

As shown in FIGS. 7 and 12, the electronic component E further includes a driving circuit board 13. The driving circuit board 13 is bonded to the second conductive pad 22 of the wiring board 100, so that the driving circuit board 13 inputs the driving signal to the wiring board 100 through the second conductive pad 22.

Figure 13:
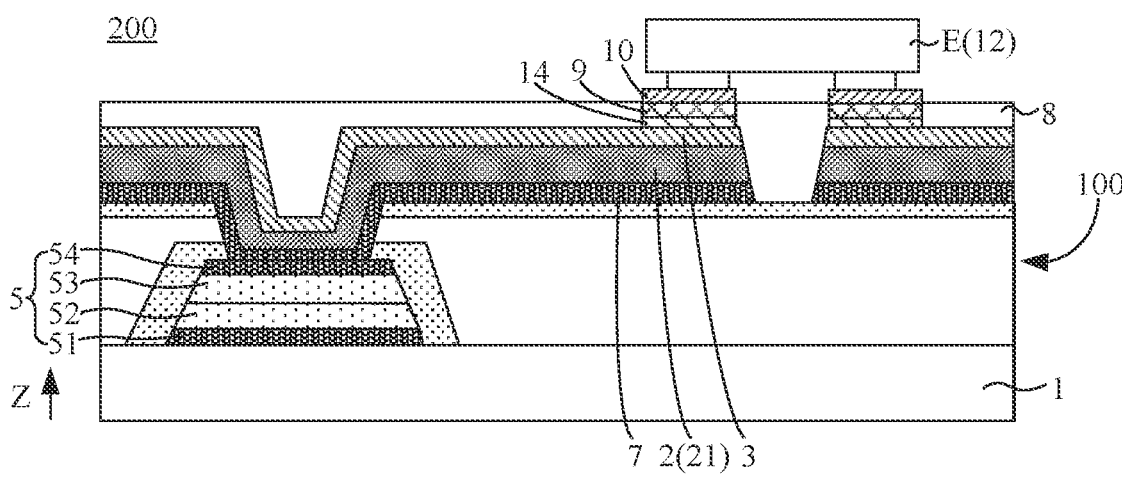
FIG. 13 is a structural diagram of another functional backplane, in accordance with some embodiments.

As shown in FIG. 13, some embodiments of the present disclosure also provide a functional backplane 200. The functional backplane 200 includes a substrate 1, conductive pads 2, an oxidation protective layer 3, second plating layers 14, intermetallic compound layers 9, conductive connection layers 10 and electronic components E. An electronic component E is electrically connected to a conductive connection layer 10.

As shown in FIG. 13, the conductive pads 2 are disposed on the substrate 1, and the conductive pad 2 is configured to be electrically connected to the electronic component E to transmit an electrical signal to the electronic component E.

For example, the material of the conductive pad 2 includes copper.

As shown in FIG. 13, in the direction Z perpendicular to the substrate 1 and directed from the substrate 1 to the conductive pad 2, the oxidation protective layer 3, the second plating layer 14, the intermetallic compound layer 9 and the conductive connection layer 10 are stacked in sequence.

A material of the oxidation protective layer 3 includes a nickel-palladium-based alloy, which has good adhesion to copper. The oxidation protective layer 3 may function to prevent oxidation of the conductive pad 2 and protect the conductive pad 2.

It will be noted that the "nickel-palladium-based alloy" refers to an alloy in which nickel and palladium are used as base metals and other metal(s) are doped in the base metals.

For example, the nickel-palladium-based alloy includes one or more of a nickel-palladium alloy, a copper-nickel-palladium alloy, a tungsten-nickel-palladium alloy, a nickel-aluminum-palladium alloy, a nickel-titanium-palladium alloy, a nickel-vanadium-palladium alloy, a nickel-zirco-nium-palladium alloy, a nickel-gold-palladium alloy, a nickel-yttrium-palladium alloy, a nickel-niobium-palladium alloy, a nickel-platinum-palladium alloy, a nickel-tin-palla-dium alloy, a nickel-silver-palladium alloy and a nickel-tantalum-palladium alloy.

For example, a thickness of the oxidation protective layer 3 is in a range of 0.6 μm to 1.5 μm, such as 0.6 μm, 0.8 μm, 1 μm, 1.3 μm or 1.5 μm.

It will be understood that, in the process of fixedly connecting the electronic component E to the conductive pad, the solder may form the intermetallic compound layer 9 with the oxidation protective layer 3, and a film layer formed after solidifying of the solder is the conductive connection layer 10; and the high temperature causes pal-ladium in the oxidation protective layer 3 to be melted to form the second plating layer 14, which is formed between the intermetallic compound layer 9 and the oxidation pro-tective layer 3.

In addition, the conductive pad 2 and the oxidation protective layer 3 each may be formed by using the mag-netron sputtering process, which avoids a corresponding problem caused by using the ENIG process.

For example, a thickness of the second plating layer 14 is in a range of 0.05 μm to 0.1 μm, such as 0.05 μm, 0.06 μm, 0.075 μm, 0.08 μm or 0.1 μm.

For the functional backplane 200 provided in the embodi-ments of the present disclosure, in the process of fixedly connecting the electronic component to the conductive pad by the solder, the solder may form the intermetallic com-pound layer 9 with the oxidation protective layer 3; in addition, the high temperature causes palladium in the oxidation protective layer 3 to be melted to form the second plating layer 14, which is formed between the intermetallic compound layer 9 and the oxidation protective layer 3. The second plating layer 14 and the oxidation protective layer 3 may prevent the solder from being in contact with the conductive pad 2, which avoids the formation of the inter-metallic compound between the solder and the conductive pad 2. In this way, since the shear strength of the interme-tallic compound layer 9 is small, during the removal of the electronic component E, the electronic component E is disconnected at the intermetallic compound layer 9, and a portion of the second plating layer 14 or the oxidation protective layer 3 may be removed together, but the con-ductive pad 2 is not removed together. As a result, it avoids the damage of the conductive pad 2, which facilitates re-soldering of the electronic component E to the conductive pad 2, and improves the repairing rate of the functional backplane 200.

Figure 14:
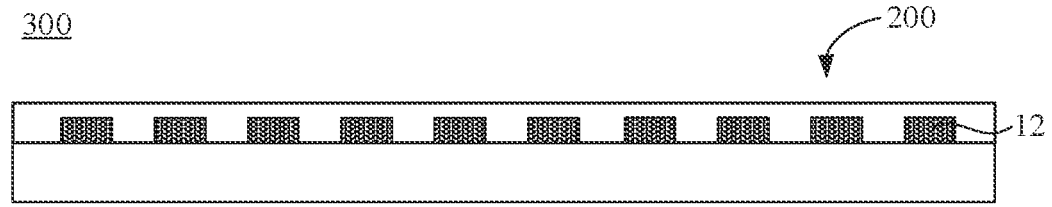
FIG. 14 is a structural diagram of a backlight module, in accordance with some embodiments.

As shown in FIG. 14, some embodiments of the present disclosure also provide a backlight module 300. The back-light module 300 includes the functional backplane 200 in any one of the above embodiments.

It will be understood that the functional backplane 200 includes the plurality of light-emitting devices 12. The light-emitting devices 12 may be LED chips. That is, the backlight module 300 is an LED backlight module.

Beneficial effects that can be achieved by the backlight module 300 in the embodiments of the present disclosure are the same as the beneficial effects that can be achieved by the functional backplane 200, and details will not be repeated here.

In addition, for the backlight module 300 provided in the embodiments of the present disclosure, a large number of light-emitting devices 12 are closely arranged, which may achieve local dimming in a small area. The backlight module 300 has better brightness uniformity and higher color con-trast within a small light mixing distance, which is beneficial to making a terminal product assembled with the backlight module 300 have properties such as ultra-thin, high color rendering and power saving. Furthermore, the backlight module 300 may be matched with a flexible display panel, so as to be used to manufacture a display apparatus with a curved screen.

Figure 15:
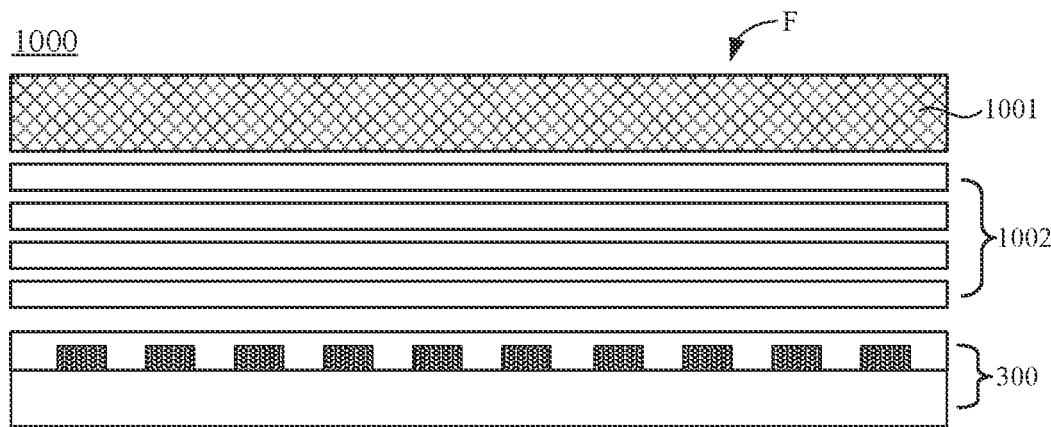
FIG. 15 is a structural diagram of a display apparatus, in accordance with some embodiments.

As shown in FIG. 15, some embodiments of the present disclosure provide a display apparatus 1000. The display apparatus 1000 includes a display panel 1001 and the backlight module 300 in the above embodiments. The dis-play panel 1001 is disposed at a light-exit side F of the backlight module 300.

For example, the display panel 1001 may be a liquid crystal display (LCD) panel.

For example, as shown in FIG. 15, the display apparatus 1000 further includes a plurality of optical films 1002 located between the backlight module 300 and the display panel 1001 for adjusting light extraction of the backlight module 300.

Beneficial effects that can be achieved by the display apparatus 1000 in the embodiments of the present disclosure are the same as the beneficial effects that can be achieved by the backlight module 300, and details will not be repeated here.

The display apparatus 1000 may be any apparatus that displays images whether in motion (e.g., a video) or sta-tionary (e.g., a still image), and whether textual or graphical. More specifically, it is contemplated that the embodiments may be implemented in or associated with a variety of electronic devices. The electronic devices may be (but not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat panel displays, computer monitors, automobile displays (e.g., odometer displays), navigators, cockpit controllers and/or displays, camera view displays (e.g., rear view camera displays in a vehicle), electronic photos, electronic billboards or signages, projec-tors, architectural structures, packaging and aesthetic struc-tures (e.g., displays for displaying images of a piece of jewelry).

Figure 16:
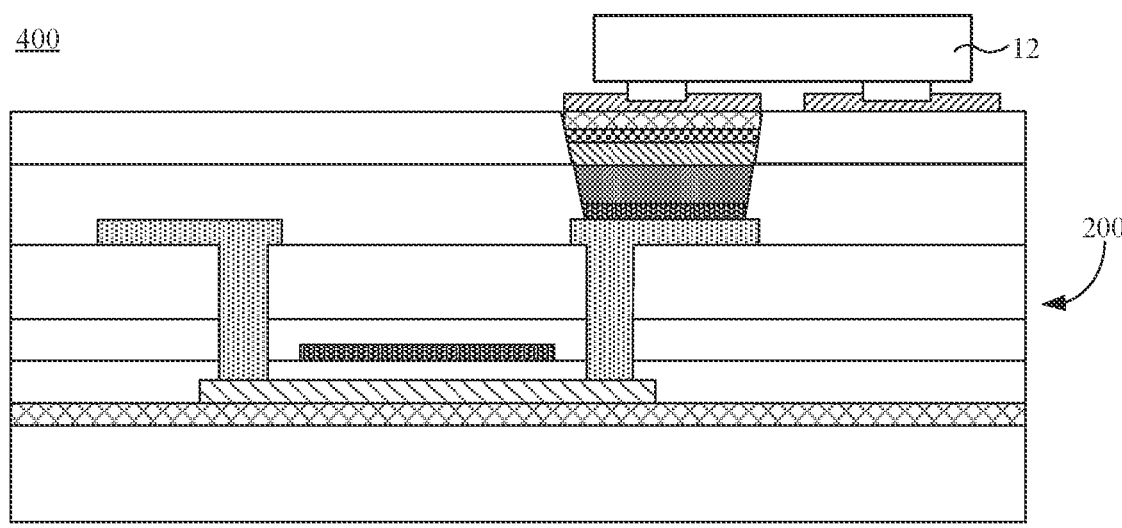
FIG. 16 is a structural diagram of a display panel, in accordance with some embodiments.

As shown in FIG. 16, some embodiments of the present disclosure also provide a display panel 400. The display panel 400 includes the functional backplane 200 in any one of the above embodiments.

It will be understood that the functional backplane 200 includes the plurality of light-emitting devices 12, and the light-emitting devices 12 may be LED chips. That is, the display panel 400 is an LED display panel. For example, the light-emitting device 12 may include light-emitting devices for emitting red light, light-emitting devices for emitting green light or light-emitting devices for emitting blue light.

Beneficial effects that can be achieved by the display panel 400 provided in the embodiments of the present disclosure are the same as the beneficial effects that can be achieved by the functional backplane 200, and details which will not be repeated here.

In the related art, an LED chip is mounted on the functional backplane through wire bonding, while in the display panel 400 provided in the embodiments of the present disclosure, the light-emitting device 12 is directly soldered to the functional backplane 200, which avoids defects of the wire bonding and unreliability of the LED chip through the wire bonding. Based on this, the display panel 400 adopts the chip on board (COB) technology, which may further reduce a distance between light-emitting devices 12, enhance a resolution of the display panel 400 and a visual effect of the terminal product assembled with the display panel 400, and reduce a viewing distance.

In addition, the display panel 400 may use a flexible substrate to manufacture the display panel 400 with the curved screen.

Figure 17:
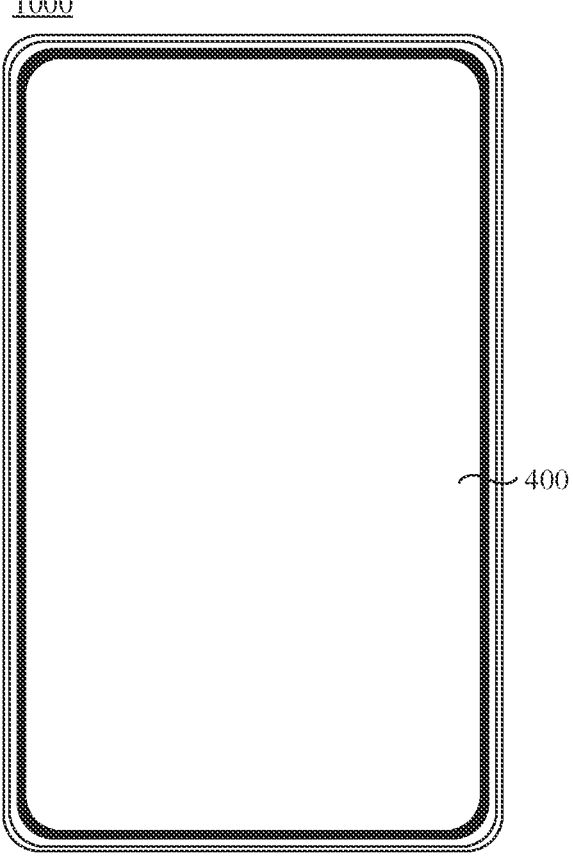
FIG. 17 is a structural diagram of another display appa-ratus, in accordance with some embodiments.

As shown in FIG. 17, some embodiments of the present disclosure also provide a display apparatus 1000. The dis-play apparatus 1000 includes the display panel 400 in the above embodiments.

Beneficial effects that can be achieved by the display apparatus 1000 in the embodiments of the present disclosure are the same as the beneficial effects that can be achieved by the display panel 400, and details will not be repeated here.

The display apparatus 1000 may be any apparatus that displays images whether in motion (e.g., a video) or sta-tionary (e.g., a still image), and whether textual or graphical. More specifically, it is contemplated that the embodiments may be implemented in or associated with a variety of electronic devices. The electronic devices may be (but not limited to), for example, mobile phones, wireless devices, personal digital assistants (PDAs), hand-held or portable computers, global positioning system (GPS) receivers/navi-gators, cameras, MPEG-4 Part 14 (MP4) video players, video cameras, game consoles, watches, clocks, calculators, TV monitors, flat panel displays, computer monitors, auto-mobile displays (e.g., odometer displays), navigators, cock-pit controllers and/or displays, camera view displays (e.g., rear view camera displays in a vehicle), electronic photos, electronic billboards or signages, projectors, architectural structures, packaging and aesthetic structures (e.g., displays for displaying images of a piece of jewelry).

The foregoing descriptions are merely specific implementations of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A wiring board, comprising:

a substrate;

conductive pads disposed on the substrate, wherein the conductive pads are configured to transmit a driving signal;

a plurality of protective layer groups stacked on a side of the conductive pads away from the substrate, wherein a protective layer group in the plurality of protective layer groups includes an oxidation protective layer and a palladium alloy layer that are stacked, and the oxidation protective layer is closer to the substrate than the palladium alloy layer, wherein a material of the oxidation protective layer includes a nickel-based alloy; and a protective pad layer disposed between two adjacent protective layer groups.

2. The wiring board according to claim 1, wherein the nickel-based alloy includes one or more of a nickel-palladium alloy, a copper-nickel alloy, a tungsten-nickel alloy, a nickel-aluminum alloy, a nickel-titanium alloy, a nickel-vanadium alloy, a nickel-zirconium alloy, a nickel-gold alloy, a nickel-yttrium alloy, a nickel-niobium alloy, a nickel-platinum alloy, a nickel-tin alloy, a nickel-silver alloy and a nickel-tantalum alloy.

3. The wiring board according to claim 1, wherein a thickness of the oxidation protective layer is in a range of 0.5 μm to 1.45 μm, inclusive; and/or a mass proportion of nickel in the material of the oxidation protective layer is in a range of 40% to 95%, inclusive.

4. The wiring board according to claim 1, wherein a thickness of the palladium alloy layer is in a range of 0.05 μm to 0.1 μm, inclusive; and/or a sum of a thickness of the oxidation protective layer and the thickness of the palladium alloy layer is in a range of 0.6 μm to 1.5 μm, inclusive.

5. The wiring board according to claim 1, further comprising:

driving circuits disposed between the substrate and the conductive pads, wherein a conductive pad in the conductive pads is electrically connected to a driving circuit in the driving circuits.

6. The wiring board according to claim 1, further comprising:

traces disposed on the substrate, wherein the conductive pads are located on a side of the traces away from the substrate, and a conductive pad in the conductive pads is electrically connected to a trace in the traces.

7. The wiring board according to claim 6, wherein the trace includes a first adhesive layer, a first conductive layer and an electroplated metal layer that are stacked in a direction perpendicular to the substrate and directed from the substrate to the protective layer group.

8. The wiring board according to claim 7, wherein a material of the first adhesive layer includes one or more of a molybdenum alloy, a titanium alloy, a tungsten alloy, a nickel alloy, a molybdenum-based alloy and a nickel-based alloy; and materials of the first conductive layer and the electroplated metal layer each include copper.

9. The wiring board according to claim 6, further comprising:

at least one insulating layer covering the traces, wherein the conductive pad is electrically connected to the trace through a via hole penetrating through the at least one insulating layer; or the wiring board further comprising the at least one insulating layer covering the traces, wherein the conductive pad is electrically connected to the trace through the via hole penetrating through the at least one insulating layer, and the at least one insulating layer includes a first passivation layer, a planarization layer and a second passivation layer that are stacked in a direction perpendicular to the substrate and directed from the substrate to the protective layer group.

10. The wiring board according to claim 6, further comprising:

a second adhesive layer disposed between the traces and the conductive pads, wherein the conductive pad is electrically connected to the trace through a portion of the second adhesive layer; or the wiring board further comprising the second adhesive layer disposed between the traces and the conductive pads, wherein the conductive pad is electrically connected to the trace through the portion of the second adhesive layer, and a material of the second adhesive layer includes one or more of a molybdenum alloy, a titanium alloy, a tungsten alloy, a nickel alloy, a molybdenum-based alloy and a nickel-based alloy.

11. The wiring board according to claim 6, wherein the trace includes a first adhesive layer, a first conductive layer, a second conductive layer and an anti-oxidation conductive layer that are stacked in a direction perpendicular to the substrate and directed from the substrate to the protective layer group.

12. The wiring board according to claim 11, wherein a material of the first adhesive layer includes one or more of a molybdenum alloy, a titanium alloy, a tungsten alloy, a nickel alloy, a molybdenum-based alloy and a nickel-based alloy;

materials of the first conductive layer and the second conductive layer each include copper; and a material of the anti-oxidation conductive layer includes one or more of molybdenum alloy, titanium alloy, tungsten alloy, nickel alloy, a molybdenum-based alloy and a nickel-based alloy.

13. A functional backplane, comprising:

the wiring board according to claim 1;

intermetallic compound layers and conductive connection layers, wherein an intermetallic compound layer and a conductive connection layer are stacked on the wiring board in a direction perpendicular to the substrate of the wiring board and directed from the substrate to the protective layer group; and electronic components, wherein an electronic component is electrically connected to the conductive connection layer.

14. The functional backplane according to claim 13, wherein the intermetallic compound layer is disposed between the conductive connection layer and the palladium alloy layer of the wiring board; or the palladium alloy layer includes hollowed-out areas; and a portion of the intermetallic compound layer is located between the palladium alloy layer and the conductive connection layer, and another portion of the intermetallic compound layer is in contact with the oxidation protective layer of the wiring board through a hollowed-out area in the hollowed-out areas.

15. The functional backplane according to claim 13, further comprising: first plating layers, wherein a first plating layer is disposed between the palladium alloy layer and the intermetallic compound layer; and/or the wiring board has a device area and a bonding area; the conductive pads include first conductive pads disposed in the device area, and second conductive pads disposed in the bonding area; and the electronic component includes: a light-emitting device bonded to a first conductive pad in the first conductive pads, and a driving circuit board bonded to a second conductive pad in the second conductive pads.

16. A backlight module, comprising: the functional backplane according to claim 13.

17. A display apparatus, comprising:

a display panel; and the backlight module according to claim 16, the display panel being disposed at a light-exit side of the backlight module.

18. A display panel, comprising: the functional backplane according to claim 13.

19. A display apparatus, comprising: the display panel according to claim 18.

* * * * *